(12) United States Patent  (10) Patent No.: US 8,125,237 B2
Sellathamby et al.  (45) Date of Patent: Feb. 28, 2012

(54) THIN FILM TRANSISTOR ARRAY HAVING TEST CIRCUITRY

(75) Inventors: Christopher V. Sellathamby, Edmonton (CA); Steven Slupsky, Edmonton (CA); Raymond George Decorby, Edmonton (CA); Brian Moore, Edmonton (CA)

(73) Assignee: Scanimetrics Inc., Edmonton (CA)

( * ) Notice: Subject to any disclaimer, the term of this patent is extended or adjusted under 35 U.S.C. 154(b) by 173 days.

(21) Appl. No.: 12/374,419

(22) PCT Filed: Jul. 17, 2007

(86) PCT No.: PCT/CA2007/001249
§ 371 (c)(1),
(2), (4) Date: Jan. 20, 2009

(87) PCT Pub. No.: WO2008/009105
PCT Pub. Date: Jan. 24, 2008

(65) Prior Publication Data
US 2009/0201042 A1  Aug. 13, 2009

Related U.S. Application Data

(60) Provisional application No. 60/831,269, filed on Jul. 17, 2006.

(51) Int. Cl.
*G01R 31/26* (2006.01)

(52) U.S. Cl. .............................. 324/760.02; 324/760.01

(58) Field of Classification Search ................... None
See application file for complete search history.

(56) References Cited

U.S. PATENT DOCUMENTS 3,947,842 A * 3/1976 Hilsum et al. ............... 345/81
(Continued)

FOREIGN PATENT DOCUMENTS

EP  0436777 A2  7/1991
(Continued)

OTHER PUBLICATIONS

Carlson, D.E., "Amorphous Silicon Solar Cells," IEEE Transaction on Election Devices 24(4):449-453, Apr. 1977.
(Continued)

*Primary Examiner* — Minh N Tang
(74) *Attorney, Agent, or Firm* — Christensen O'Connor Johnson Kindness PLLC

(57) ABSTRACT

A thin film transistor (TFT) array having test circuitry includes a thin film transistor array body having a plurality of pixels. Test circuitry is integrally formed with the body. The test circuitry includes a power supply for supplying power via the test circuitry to the body; and a plurality of wireless switches to activate selected pixels.

47 Claims, 15 Drawing Sheets

U.S. PATENT DOCUMENTS

| | | | | |
|---|---|---|---|---|
| 4,481,510 | A | * | 11/1984 | Hareng et al. ............. 345/100 |
| 6,590,624 | B1 | * | 7/2003 | Lee ............................ 349/54 |
| 6,873,175 | B2 | | 3/2005 | Toro-Lira |
| 6,985,003 | B2 | | 1/2006 | Li |
| 7,012,445 | B2 | | 3/2006 | Itagaki |
| 2005/0206404 | A1 | | 9/2005 | Itagaki |
| 2006/0192752 | A1 | * | 8/2006 | Ando ...................... 345/156 |
| 2006/0237627 | A1 | | 10/2006 | Gardner |
| 2006/0267625 | A1 | * | 11/2006 | Kaneko ................... 324/770 |

FOREIGN PATENT DOCUMENTS

| | | |
|---|---|---|
| WO | 2004070685 A1 | 8/2004 |

OTHER PUBLICATIONS

Henley, F., et al., "A High Speed Flat Panel In-Process Test System for TFT Array Using Electro-Optic Effects," IEICE Transactions on Electronics E76-C(1):64-67, Jan. 1993.

Henley, F.J., "An Ultra High Speed Test System," IEEE Design & Test of Computers, pp. 18-24, Feb. 1989.

Howard, W.E., "Thin-Film-Transistor/Liquid Crystal Display Technology—An Introduction," IBM Journal of Research and Development 36(1):3-10, Jan. 1992.

Jenkins, L.C., et al., "Functional Testing of TFT/LCD Arrays," IBM Journal of Research and Development 3(1):59-68, Jan. 1992.

Kido, T., et al., "Optical Charge-Sensing Method for Testing and Characterizing Thin-Film Transistor Arrays," IEEE Journal of Selected Topics in Quantum Electronics 1(4):993-1001, Dec. 1995.

Lee, J.B., et al., "A Miniaturized High-Voltage Solar Cell Array as an Electrostatic MEMS Power Supply," Journal of Microelectromechanical Systems 4(3):102-108, Sep. 1995.

Liang, J., et al., "Hole-Mobility Limit of Amorphous Silicon Solar Cells," Applied Physics Letters 88(6): 3 pages, Feb. 10, 2006.

Merten, J., et al., "Improved Equivalent Circuit and Analytical Model for Amorphous Silicon Solar Cells and Modules," IEEE Transactions on Electron Devices 45(2):423-429, Feb. 1998.

Son, J.S., et al., "Detection of Amorphous-Silicon Residue Generated in Thin-Film Transistor Manufacturing Process Using a High Spectral Response of Amorphous-Silicon Layer on Green Light Source," Current Applied Physics 6(1):84-90, Jan. 2006.

* cited by examiner

THIN FILM TRANSISTOR ARRAY HAVING TEST CIRCUITRY

FIELD

The present application relates to thin film transistor arrays, such as are used for liquid crystal displays, that have test circuitry.

BACKGROUND

Flat panel displays based on amorphous silicon thin film transistors (TFT) and liquid crystals (TFT-LC displays) are of great commercial importance, having captured a substantial portion of the flat-screen television and computer display markets. To reduce manufacturing costs and improve yields, in-process testing (IPT) is a critical component of the manufacturing process. It is highly desirable that the majority of defects within the TFT circuitry are identified (and, if possible, corrected) prior to the expensive steps that follow (filling with liquid crystal, alignment of the color filter glass, and addition of driver circuitry, etc.). Furthermore, there is increasing demand that all completed displays are entirely free of pixel defects. Reliable testing and repair of the TFT array is the preferred approach for achieving such a goal.

A method of testing TFT arrays is one in which the columns (TFT data lines) and rows (TFT gate lines) of the array are temporarily shorted in some fashion to a set of probe pads via bus circuitry that occupies space between TFT arrays. For example, every second gate line within several TFT panels on a common glass substrate (base plate) is wired to a common bus (gate even bus) and the alternate gate lines are wired to a second common bus (gate odd bus). Similarly, the alternate data lines are wired to a pair of common buses (data even and data odd buses). The bus lines and their associated contact probe pads occupy space between the individual TFT arrays (i.e. displays) manufactured in parallel on a single base substrate, and are removed when the individual arrays are scribed for final assembly of the displays. The aforementioned wiring arrangement enables the TFT arrays to be driven according to certain spatial and temporal patterns, such as a blinking checkerboard pattern, that can be imaged and analyzed for the purposes of fault detection.

SUMMARY

There is provided a thin film transistor (TFT) array having test circuitry, which comprises a thin film transistor array body having a plurality of pixels. Test circuitry is integrally formed with the body. The test circuitry comprises means for supplying power via the test circuitry to the body; and a plurality of wireless switches to activate selected pixels.

BRIEF DESCRIPTION OF THE DRAWINGS

These and other features will become more apparent from the following description in which reference is made to the appended drawings, the drawings are for the purpose of illustration only and are not intended to be in any way limiting, wherein.

DETAILED DESCRIPTION

Figure 1:
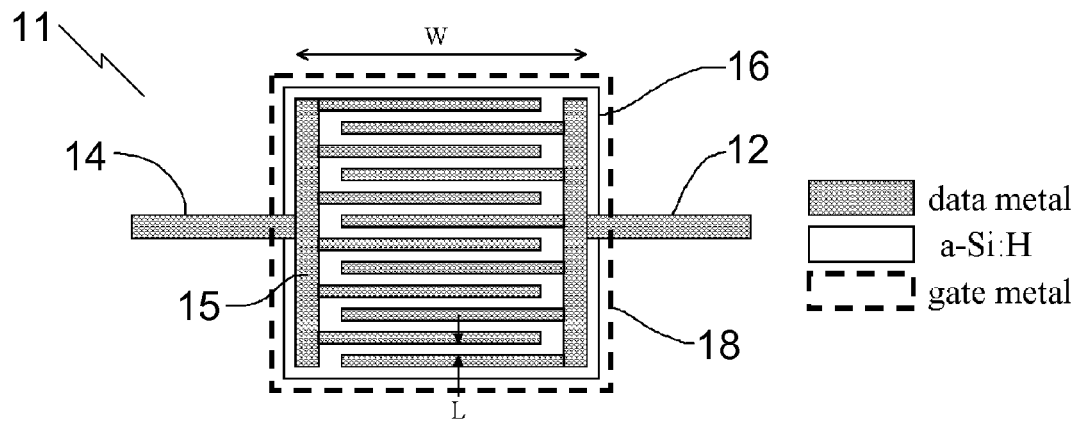
FIG. 1 is a schematic diagram of an interdigitated electrode geometry for a photoconductive switch fabricated in a commercial TFT process.

A thin film transistor (TFT) array having test circuitry will now be described with reference to FIGS. 1 through 29.

The apparatus and method for testing thin film transistor (TFT) arrays described below is generally more energy, time and space efficient than previous methods. The efficiencies are derived from driving only a subset of the pixels that lie underneath the sensing element of the testing device at a given time using wireless switches. In one embodiment, this is done by exploiting the photosensitivity of a photoactive layer at the interface between the power supply (driving buses) and the gate rows and data columns, so that it is possible to drive only the portion of the TFT array that lies underneath the sensing and image analysis unit at that given time. Further, reducing mechanical obstruction of the probes with the sensor improves throughput. In other embodiments, this may be done using other wireless switches.

A photoconductor is provided for use in photoconductive switches, the photoconductive layer being highly resistive in the dark and at low to moderate light levels, with the consequence that the resistance across such a switch is normally very large and the switch is normally in the open state so that the circuitry attached to one electrode is electrically isolated from the circuitry attached to the other electrode. The principles herein are described with reference to "light." It will be recognized that the principles apply also for various forms of electromagnetic radiation, including both visible light and radiation outside the range of visible light. When the photoconductor is illuminated by an intense light source of the appropriate wavelength to efficiently excite photo-carriers within the layer, the effective resistance between the opposing electrodes is reduced by more than several orders of magnitude, from the megaOhm (MΩ) or gigaOhm (GΩ) range to the kiloOhm (kΩ) range, so that illumination by the light effectively closes the switch thus approximating a short-circuit. Photoconductive switches are toggled on an individual basis by controlling the output of the light source, allowing control over the flow of drive current within the TFT substrate, so that switches are turned on in the vicinity of the sensing and image analysis unit at a given time while, at the same time, TFTs away from the sensing unit are not drawing drive power unnecessarily.

In the following description, the term "light" is used to describe any electromagnetic radiation that can be used for the purposes of the testing circuit, including both visible light and electromagnetic radiation of other frequencies, such as radio frequencies. It has been found through experimentation that, in one particular embodiment, it is advantageous and practical to use LEDs emitting in the green light region and a photoactive material activated by this light. However, the principles discussed herein will also apply for other electromagnetic radiation for activation of other photoactive materials. The description below is provided as an example illustrative of the range of materials and corresponding electromagnetic radiation for their activation.

In addition, other contactless means for transmission of signals or energy between devices may also be used. These include inductive coupling and capacitive coupling, in addition to the photoactivation of a photoactive material described below, such as those discussed in U.S. Pat. No. 6,885,202 (Slupsky) and in PCT Patent Application No. WO2005/076885 (Miller). Different embodiments may incorporate one or more of any of these means. Below, examples for applications using photoactivation, for example for optical switching, are described. However, an equivalent capability and function is achievable through the use of inductive or capacitive coupling components. Limitations of TFT fabrication processes limit the types of electronic devices that can be formed on a TFT panel. Such limitations can impose design restrictions when implementing various forms of coupling. For example, many conventional TFT processes do not allow for the integration of P-channel devices. Further, the parameters of devices drift over time.

Testing Arrays Using Embedded Photoconductive Switches

Since amorphous hydrogenated silicon (hereinafter abbreviated as a-Si:H) is well known to be an efficient photoconductor, photoconductive switches can be fabricated in a commercially standard TFT fabrication process. It will be recognized that there are several alternative inorganic and organic semiconductor materials that may be used in place of a-Si:H. For example, materials used in the fabrication of active matrix organic light emitting diode arrays formed on a substrate ("AM OLED")". FIG. 1 shows an example of a photoconductive switch 11 that may be used. The photoconductive switch 11 is formed on a TFT substrate in which opposing electrodes 12 and 14 are patterned in the data metal layer 15, which is designed for ohmic contact with the a-Si:H layer 16. Since intrinsically a-Si:H is highly resistive in the dark or in low to moderate light levels, the resistance across such a switch is normally very large, in the MΩ to GΩ range. Thus the switch is normally in the open state and the circuitry attached to one electrode is effectively electrically isolated from the circuitry attached to the other electrode. When a-Si:H is illuminated by an intense light source of the appropriate wavelength to efficiently excite photo-carriers within the a-Si:H layer, the effective resistance between the opposing electrodes is reduced by up to more than six orders of magnitude, so that illumination by the light effectively closes the switch. For example, green light with intensity in the 10-100 W/cm² range can result in a reduction of the device resistance form the MΩ or GΩ range to the kΩ range. Since the resistance associated with a gate or data line within a TFT array is typically several kΩ, such a switch when under this level of illumination well approximates a short-circuit for the present application.

After even brief illumination by high intensity light, the a-Si:H layer 16 in the photoconductive switch 11 is modified due to the well-known Staebler-Wronski effect. This effect produces a large increase in the carrier trap density, and therefore reduces the dark conductivity by several orders of magnitude. Fortunately, this increase in trap density has little effect on the photoconductivity at very high light intensity, since the density of photogenerated carriers greatly exceeds the trap density, even following Staebler-Wronski degradation. The net effect is that the photoconductive switch exhibits a higher on-off contrast after brief light exposure because the "on" state under intense light resistance remains relatively stable while the "off" state (dark) resistance increases by orders of magnitude.

Figure 2:
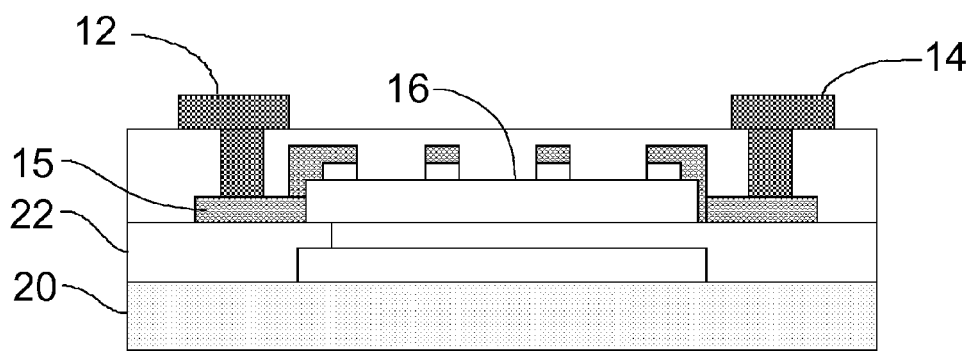
FIG. 2 is a schematic diagram in cross-section of a photoconductive switch fabricated in a commercial TFT process.

FIG. 2 shows the cross-section of a photoconductive switch 11 that is entirely compatible with a typical bottom-gate TFT processes. Optionally, gate metal 18 can be included underneath the photosensitive a-Si:H layer 16, in order to reflect unabsorbed light back towards the a-Si:H layer, thereby improving the efficiency of the switch. The switch 11 is positioned on a glass substrate 20, and has a gate insulator 22.

Figure 3:
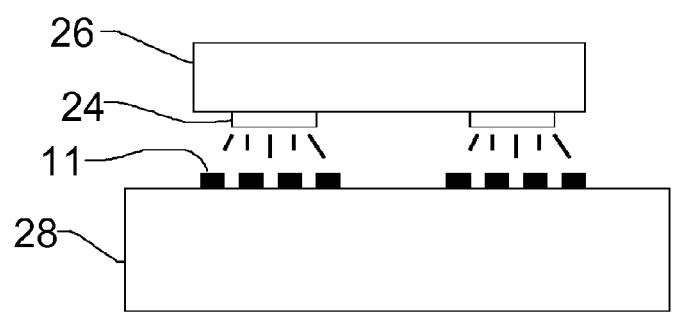
FIG. 3 is a schematic diagram showing the illumination of amorphous silicon photoconductive switches located on the TFT array.

Referring to FIG. 3, the basis of the test procedure is the addition of light sources 24, such as green LEDs of sufficient intensity, to the sensor units (probe cards) 26 that are currently used to test TFT arrays. These LED sources 24 are aligned overtop the previously described photoconductive 11 switches formed on the TFT substrate 28, and their junction area is chosen to be well matched to the area of the corresponding photoconductive switches, as illustrated. By controlling the light output of the LEDs 24, the photoconductive switches 11 are toggled on an individual basis. In this way, control of the photoconductive switches 11 allows control over the flow of drive current within the TFT substrate 28. Thus, switches 11 can be turned on in the vicinity of the sensing and image analysis unit 26 at a given time, while at the same time TFTs away from the sensing unit 26 are not drawing drive power unnecessarily.

Figure 4:
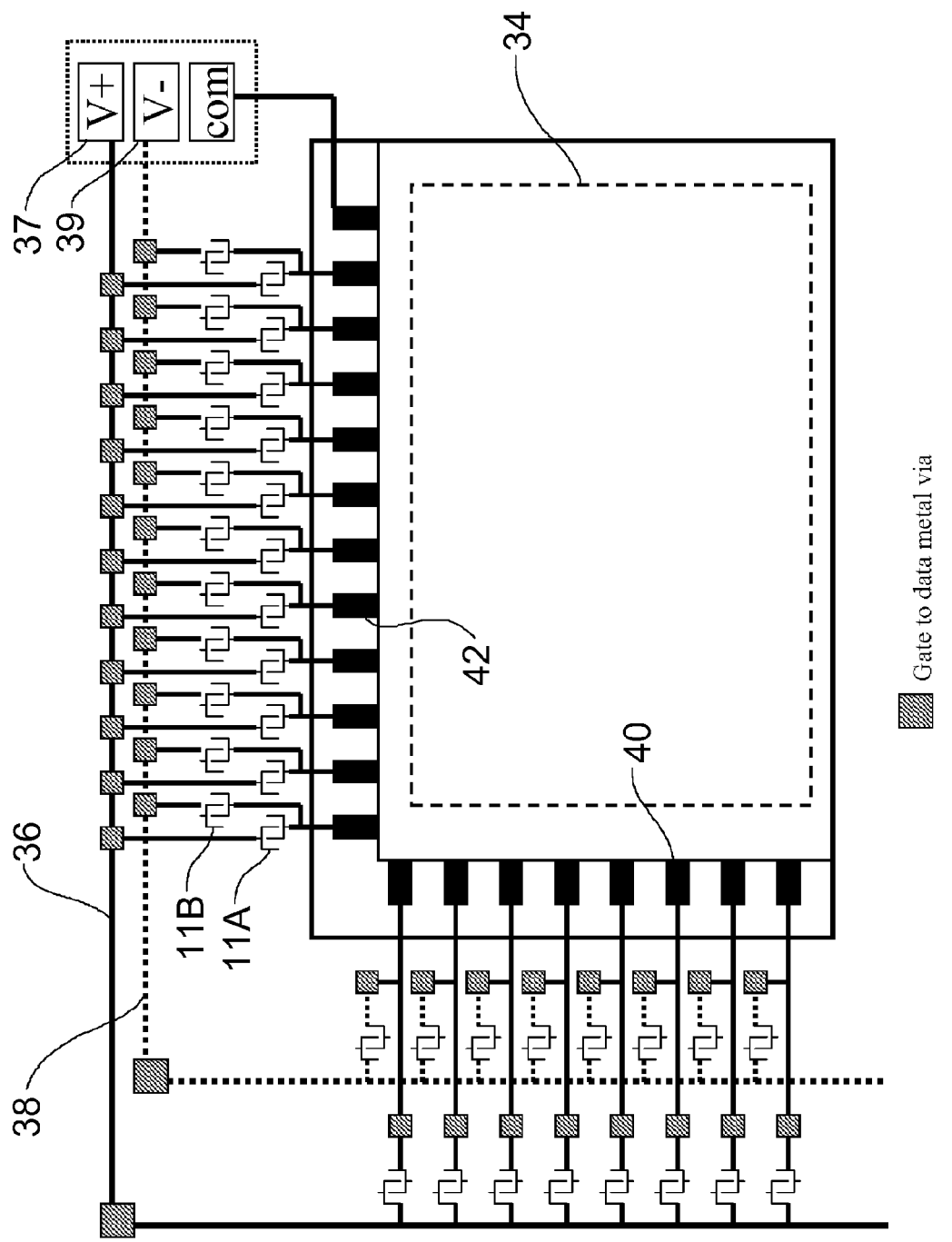
FIG. 4 is a schematic diagram showing a TFT array in which every gate row line or data column line can be connected to a positive or negative voltage rail through the control of an associated pair of photoconductive switches.
Figure 5:
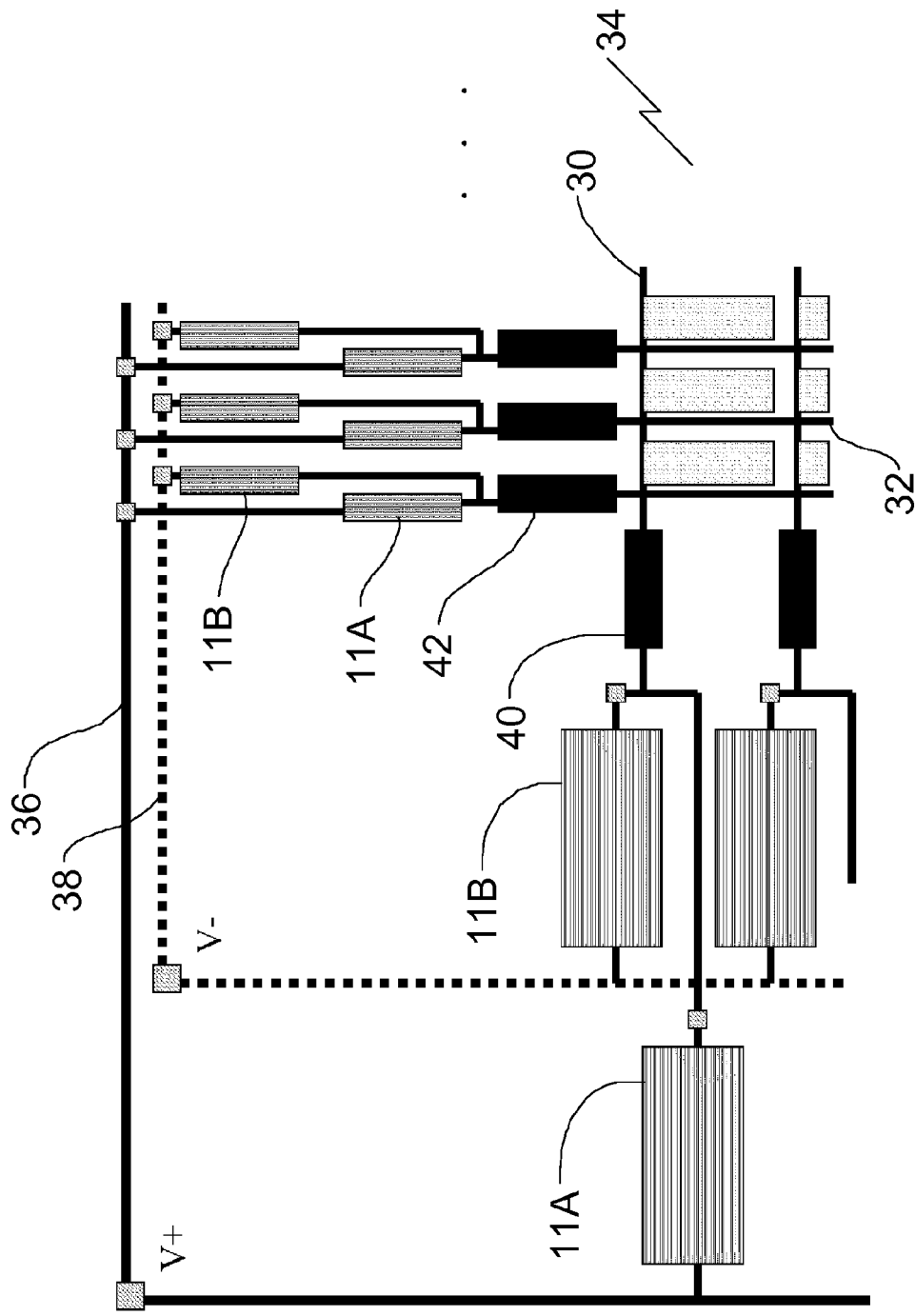
FIG. 5 is a schematic diagram showing details of the interconnection of photoconductive switches between the gate and data lines of a TFT array and a pair of positive and negative voltage supply rails.

One possible configuration for exploiting this switch functionality is shown in FIG. 4, where every gate line 30 and every data line 32 (shown in FIG. 5) within every TFT array 34 has two associated photoconductive switches 11. Referring to FIG. 5, for each gate row 30 or data column 32 corresponding to gate row pads 40 and data column pads 42, respectively, there is one photoconductive switch 11A connected to a positive supply rail 36 and a second photoconductive switch 11B connected to a negative supply rail 38. Referring to FIG. 4, supply rails 36 and 38 are energized through pads 37 and 39, respectively. By controlling the light output of LEDs 24 lying overtop these switches 11 as described with reference to FIG. 3, a given line can be charged to either the positive or negative supply voltage. This architecture and method of operation allows an arbitrary section of the array to be driven according to some arbitrary spatial and temporal pattern, typically one that is binary digital, such as a blinking checkerboard or more complex pattern.

FIG. 5 is a more detailed drawing of the interconnections shown in FIG. 4. The circuitry shown in FIGS. 4 and 5 offers the following advantages for testing when compared to previous TFT array testing apparatus and strategies:

(i) The supply buses (rails) 36 and 38 may be driven by a static voltage, allowing higher resistance bus lines 30 and 32 to be used.

(ii) The number of required physical contact probe pads 40 and 42 is reduced.

(iii) Only TFT lines whose associated photoconductive switches are 'on' draw current from the supply buses (rails) 36 and 38.

In one embodiment, the size of switches 11A and 11B connected to gate rows 30 is approximately 250×500 μm, and the size of switches 11A and 11B connected to data columns 32 is approximately 50×250 μm. However, it will be recognized that the geometry and dimensions of the elements illustrated in FIGS. 4 and 5 are provided as one illustrative example, and that other designs are possible using different geometries, such as polygon or circular, and different sizes.

Thus, the complexity of the test circuitry is shifted from the TFT substrate, where it is mostly made up of temporary structures lying within the scribe channels, to the test unit or probe card 26, which is a 'permanent' assembly.

The approach shown in FIGS. 4 and 5 requires a high density of photoconductive switches 11, and therefore associated LEDs 24. This limits the size of the switches 11, which must be compatible with the inter-gate-line and inter-data-line spacings in the TFT array, and therefore also their minimum on-state resistance.

Figure 6:
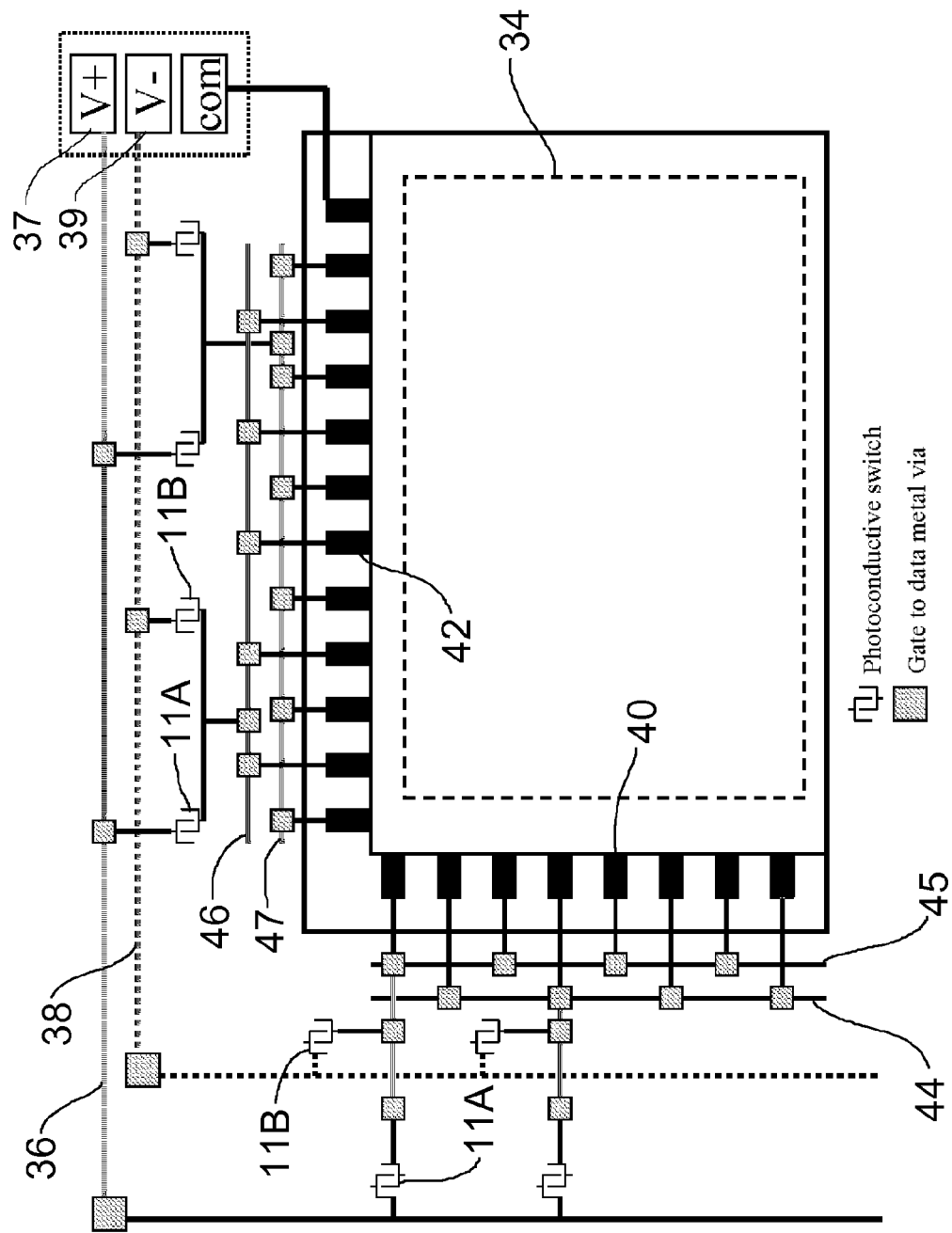
FIG. 6 is a schematic diagram showing an alternative arrangement for connecting the gate and data lines of a TFT array to a pair of positive and negative voltage supply rails, connected via a reduced number of larger photoconductive switches when compared to the apparatus illustrated in FIG. 4.

An alternative approach shown in FIG. 6 addresses the issue of potential optical cross-talk arising from closely spaced switches. When light sources are situated closely together, the light intended to activate a given switch might cause some amount of photoconduction in adjacent switches. Using a lower density of photoconductive switches 11, each of which interconnects a supply rail 36 or 38 to a grouping of gate lines 44 and 45 or data lines 46 and 47, allows the switches 11 to be larger, and therefore to exhibit lower on-state resistance. When using this architecture, cross-talk becomes less problematic and the complexity of the optical interface between the LEDs and the photoconductive switches is reduced.

Figure 7:
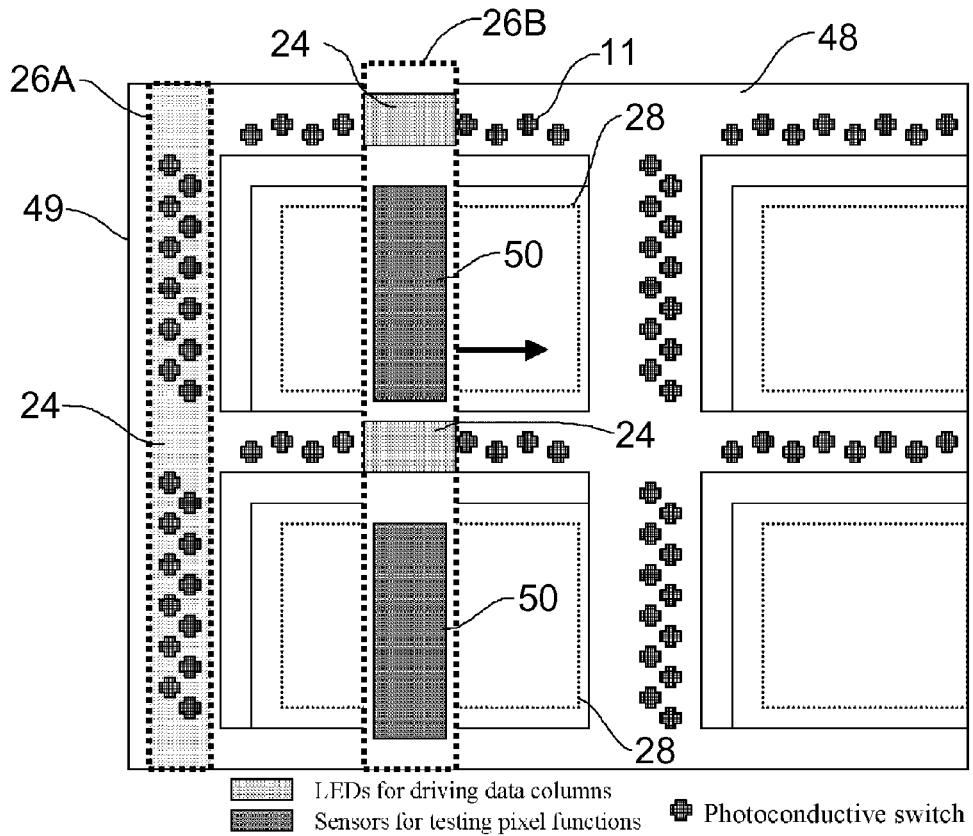
FIG. 7 is a simplified schematic diagram showing a procedure for testing adjacent TFT array panels in a parallel process in which LEDs are situated on the two testing sub-units.

One approach to testing a set of TFT panels 28 on single glass base substrate 48 is shown schematically in FIG. 7. For clarity, the gate and data lines 30 and 32, the contact pads 40 and 42, and supply rails and 36 and 38 present in FIGS. 4 and 5 are not shown. Two test sub-units 26A and 26B are interconnected via appropriate mechanical supports (not shown), and are brought in close proximity over a portion of the TFT substrate 49, typically within 10-100 μm for most voltage imaging or capacitive sensing technologies. The first testing sub-unit 26A is aligned relative to and overtop the photoconductive switches 11 associated with a portion of the gate row lines 30 of a given TFT panel 28 that were previously described with reference to FIGS. 4 and 5, or with all of the gate row lines of one or more TFT panels 28 sharing the same base substrate 48 (as shown in FIG. 7). This first testing sub-unit 26A contains an array of LED light sources 24 and associated LED drive circuitry (not shown). These LEDs 24 are driven according to some desired temporal pattern, such that the corresponding gate row lines 30 (shown in FIG. 5) are charged to the positive or negative supply voltage in some desired temporal pattern.

The second testing sub-unit 26B is scanned in a linear or step-wise fashion over the TFT array 28 or arrays whose gate lines 30 are under the control of the first testing sub-unit 26A. The second testing sub-unit contains LEDs 24 with associated LED drive circuitry (not shown), and sensing elements 50. The LEDs are configured to drive the photoconductive switches associated with the data column lines 32 shown in FIG. 5 proximate and juxtaposed beneath the second sub-unit 26B at a given time. This allows these data lines to be charged to the positive or negative supply voltage according to some desired temporal pattern. The sensing elements 50, which can be of various established types such as electro-optic or capacitively coupled sensors, monitor the response of the TFT pixels in the portion of the TFT array 34 or arrays subject to the temporal patterns described above.

By placing the data line driving LEDs 24 and the pixel charge sensors 50 on the same testing sub-unit, only those pixels corresponding to the portion of the TFT arrays 28 that is actually under test at a given time are charged or discharged by direct control of the testing sub-unit.

It will be recognized that the gate row lines 30 and the data column lines 32 can be interchanged in the testing procedure described above and shown in FIG. 7. Thus, a linear scanning testing sub-unit 26 can contain the pixel sensors 50 and LEDs 24 to drive the photoconductive switches 11 associated with the gate row lines 30. In this case, the second testing sub-unit 26B would incorporate the LEDs 24 to drive photoconductive switches 11 associated with the data column lines 32, and would be scanned at a slower rate or in a step and repeat fashion.

In an alternative testing approach (not shown), one testing sub-unit 26 may incorporate all of the LEDs 24 that drive the photoconductive switches 11 associated with gate row lines 30 and data column lines 32. A second testing sub-unit would then incorporate the sensing elements used to assess the operation of pixels in the array.

In another alternative testing approach, mechanical probes are used in combination with a testing sub-unit, where the mechanical probes drive the gate or data lines and the testing sub-unit drives the corresponding data or gate lines.

Testing Using Embedded Photoconductive Switches and Photovoltaic Cells

Aside from TFT circuitry, another major industrial application of a-Si:H is in photovoltaics (solar cells). Photovoltaic cells require a high quality (low defect) a-Si:H layer and a rectifying junction of some kind (p-n, pin, Schottky, etc.). The first requirement is met by the high quality a-Si:H layer in commercial TFT processes. The second requirement, a rectifying junction, is not normally intrinsic to TFT processes, but can be met by slightly modifying the TFT process in one of several ways.

Figure 8:
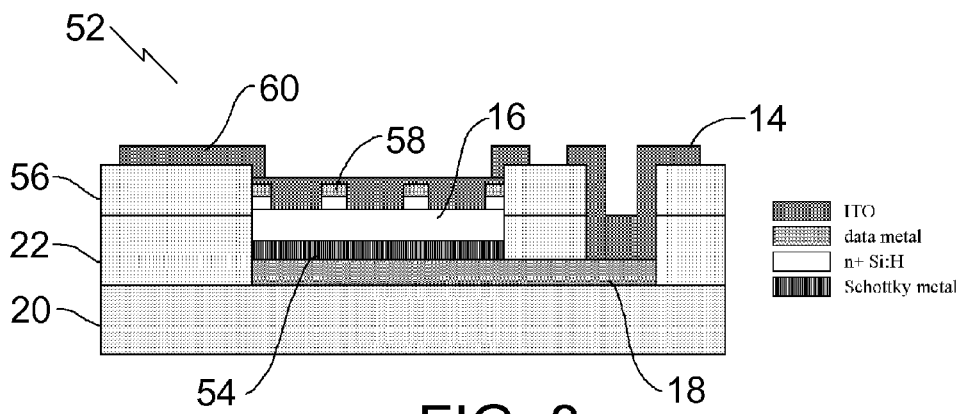
FIG. 8 is a schematic cross-section of a vertical junction Schottky photovoltaic cell fabricated in a customized commercial TFT process.

The Schottky junction-based photovoltaic cell has a relatively simple structure, and has been shown to deliver excellent performance in the context of a-Si:H. This design may be used to provide an alternate power source for powering the testing circuit. FIG. 8 shows the cross-section of one type of Schottky photovoltaic cell formed on a TFT substrate, a vertical junction cell 52. In this case, the Schottky junction is formed between the gate contact 18 and the a-Si:H layer 16. A very thin metal layer 54, chosen for optimal Schottky characteristics on a-Si:H, is added on top of the gate contact 18. Platinum (Pt) is an example of such an optimal metal. This structure requires the opening of windows in the gate insulator layer 22, and the deposition and patterning of the Schottky metal 54, prior to the deposition of a-Si:H 16. Both the gate insulator and Schottky metal patterning can be realized using the same mask and photolithography step. An optional variation would be to also add a thin insulating layer between the Schottky metal and the a-Si:H layer, in order to form a so-called metal-insulator-semiconductor (MIS) photovoltaic cell (not shown). As shown, a passivation layer 56 is also included above the gate insulator layer 22.

Figure 9:
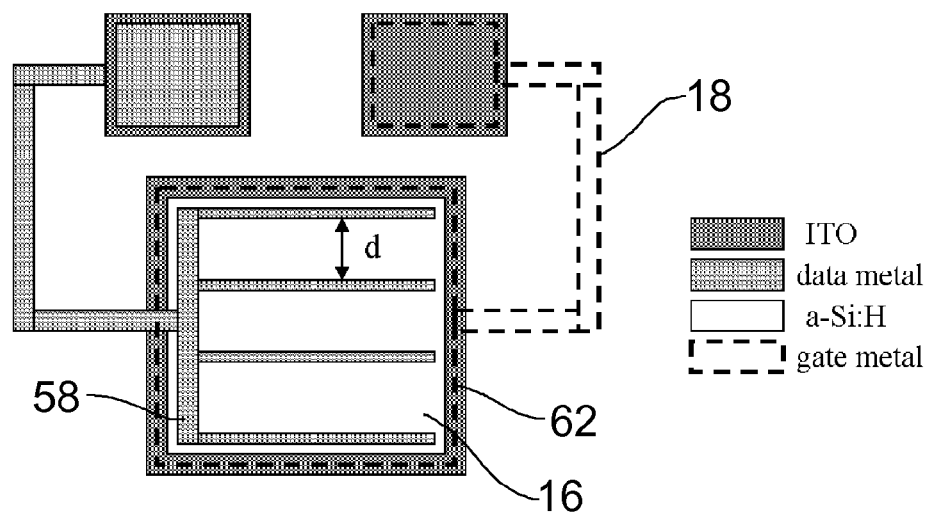
FIG. 9 shows a top view of the same schematic layout of the Schottky photovoltaic cell fabricated using a customized commercial TFT process illustrated in FIG. 8.

The top view schematic of the structure from FIG. 8 is shown in FIG. 9. The top contact 58 is an ohmic contact realized in the data metal layer from a standard process. The top contact 58 is sparsely laid out to minimize light blocking, as is typical for solar cells. A transparent conductor 60, such as indium tin oxide (ITO) which is commonly used in TFT processes, can optionally be coated over the entire active area of the photovoltaic cell 52. This has the benefit of reducing the series resistance of the cell 52, thereby improving its efficiency and drive capability. The bottom contact 62 may be connected to the gate metal layer 18 using the ITO layer, but is electrically isolated from the top contact 58.

The cell shown in FIGS. 8 and 9 has beneficial attributes, including the following three attributes. First, the Schottky metal can be selected for optimal junction characteristics. For example, platinum is known to form a high quality Schottky junction (with a high barrier voltage) on a-Si:H. This results in an efficient photovoltaic cell with high open-circuit voltage (>0.8 V) and high conversion efficiency (>5%). Second, the optional bottom gate metal contact 18 functions as an efficient mirror for light incident on the top surface. Again, as described with reference to FIG. 2, this provides enhanced incidence upon and absorption of the light by the a-Si:H layer 16, and thereby increases efficiency of the cell 52. Third, the distance between the Ohmic and Schottky contacts is quite small, i.e. the a-Si:H layer 16 is typically less than 200 nm thick, so that photogenerated carriers, especially holes, are collected by the contacts 60 and 62 prior to recombining and therefore contribute to the external current flow.

It will be recognized that the architecture of the photovoltaic cell illustrated schematically in FIGS. 8 and 9 is only one among several alternative architectures available.

Figure 10:
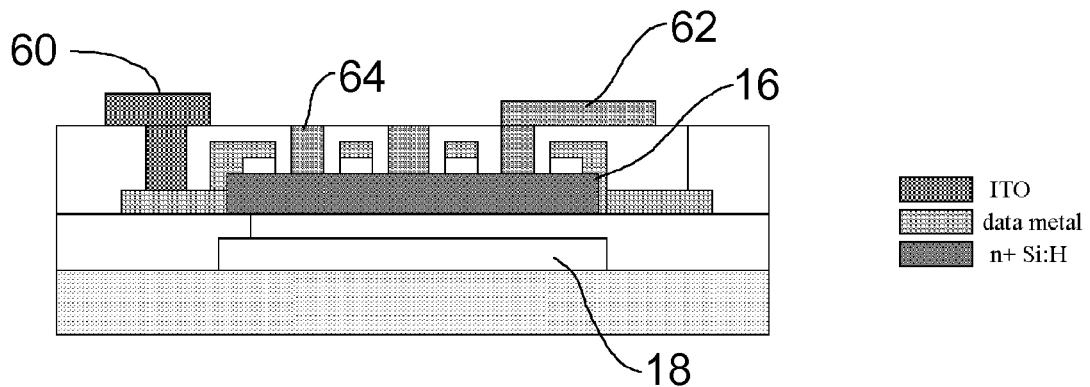
FIG. 10 shows a cross-sectional schematic of one lateral photovoltaic cell architecture.
Figure 11:
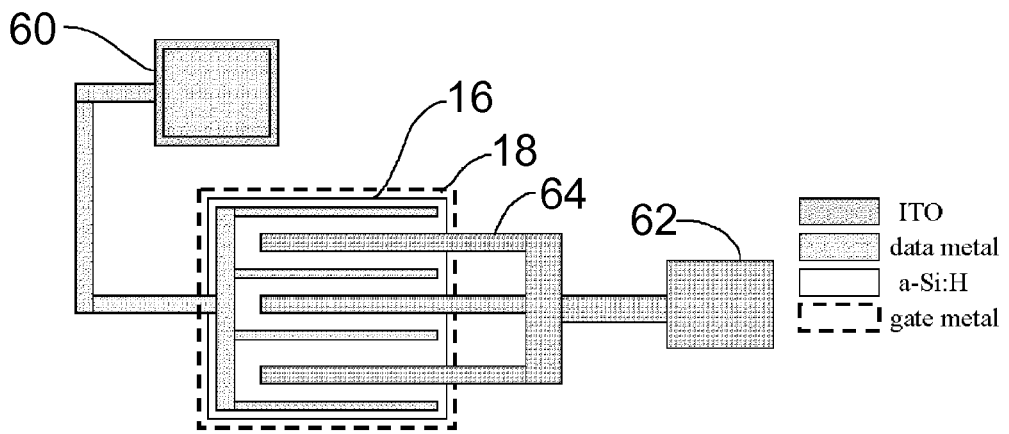
FIG. 11 shows a top view cross-sectional schematic of the lateral photovoltaic cell structure illustrated in FIG. 10.

An alternative architecture for a photovoltaic cell formed on a TFT substrate is the lateral junction structure 61 shown schematically in FIG. 10 (side view) and FIG. 11 (top view). In this case, both the ohmic contact 60 and Schottky contact 62 are made on the top surface of the a-Si:H layer 16. Furthermore, the addition of the Schottky metal electrodes 64 and associated contact pads 62 are placed at the end of the TFT fabrication process, which alternative architecture might provide advantages for some applications. As in the previous design, the Schottky metal can be chosen for optimal cell characteristics. For example, it is known that Pt forms a high barrier contact to a-Si:H, resulting in a photovoltaic cell with high open-circuit voltage. Light blockage is minimized by use of a very thin (~5-10 nm) Schottky metal layer. Again, advantageously, gate metal 18 optionally is included underneath the active a-Si:H regions 16 of the photovoltaic cells 61 so as to reflect top-incident light.

An alternative to the Schottky junction cell is the heterojunction cell in which the photovoltaic response is provided by a junction between a-Si:H and a different semiconductor (not shown). ITO is essentially a wide bandgap, n-type semiconductor and, as described above, is intrinsic to most commercial TFT processes. A heterojunction cell can be formed on a TFT substrate by replacing the Schottky metal in FIGS. 10 and 11 with ITO. Attributes of this cell are that the ITO is transparent to incident light, and that the cell comprises only materials used in standard TFT manufacturing processes.

The photovoltaic structures described, especially the vertical structure, have all the properties associated with a high quality a-Si:H Schottky solar cell:

(i) a thin, high quality amorphous silicon layer;
(ii) an optimized Schottky metal contact; and
(iii) an optimized Ohmic contact.

It is well known that photovoltaic cells of this type exhibit good properties, including an open circuit voltage greater than 0.8 V, a short circuit current density under 1 sun illumination, ~100 mW/cm$^2$, of greater than 10 mA/cm$^2$, a conversion efficiency greater than 10%, and a fill factor greater than 0.7. Thus, such a cell can deliver to an external load >5 mA/cm$^2$ at >0.5 V. Even greater efficiencies can be expected in the present case, since, in a preferred embodiment, the photovoltaic cell is illuminated by an optimized LED source rather than by solar radiation. The intensity and the wavelength band of the LED source can be selected for highest efficiency response by the photovoltaic cell.

Figure 12:
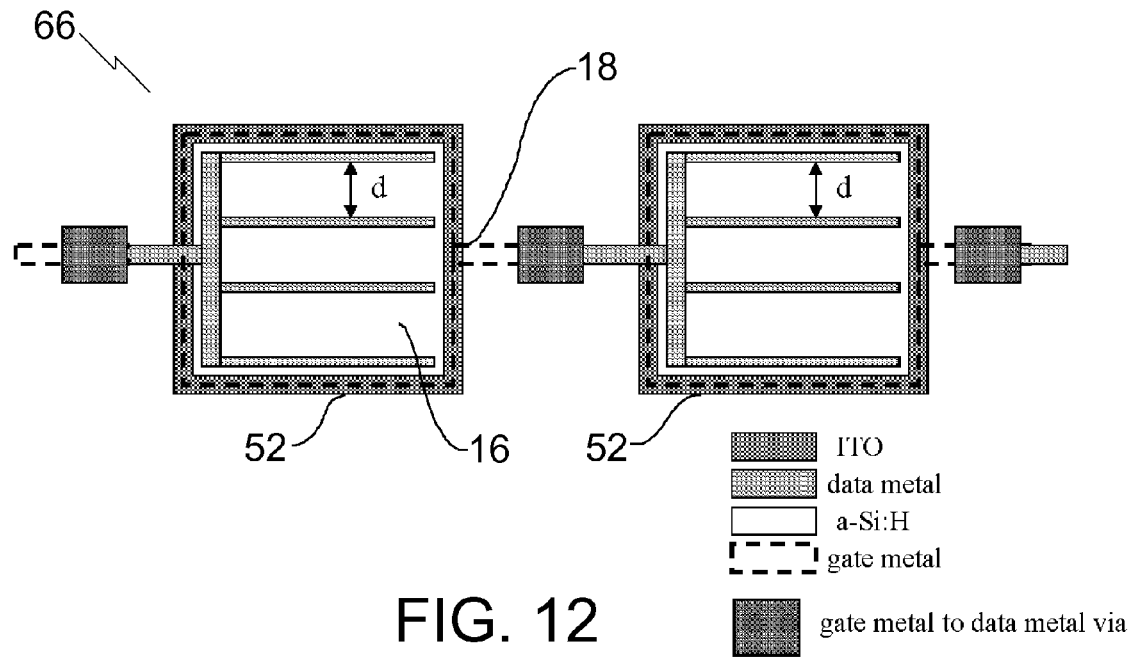
FIG. 12 is a layout schematic of the series interconnection of vertical junction Schottky cells.
Figure 13:
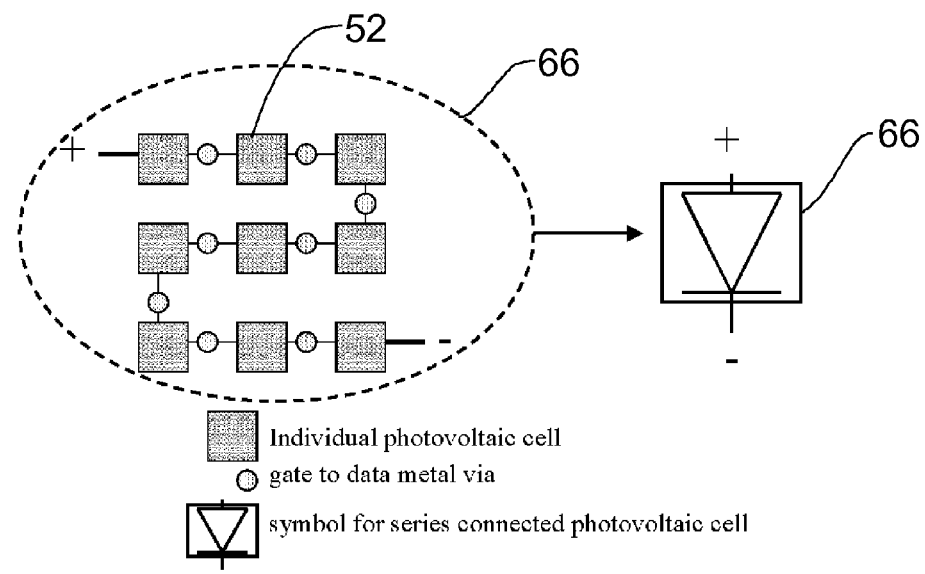
FIG. 13 is a layout schematic and symbol for a high voltage photovoltaic cell, comprising series-interconnected junction cells.

Since TFT array testing requires supply voltages greater than 10 V, it is necessary to form photovoltaic cell arrays in which the unit cells, which are the single Schottky junction devices described above, are series interconnected. An example of this type of interconnection formed on a TFT substrate is shown in FIGS. 12 and 13. To a first order approximation, the net voltage delivered by the array 66 is the sum of the voltages delivered by each unit cell 52, and the current delivered is unchanged from the single unit cell case. Thus, an array of 20 unit cells each delivering 0.5 V will produce ~10 V, or an array of 9 units as shown in FIG. 13 will produce ~4.5 V. Furthermore, the current drive capacity is determined by the area of the unit cells in the array, since the Schottky junction can deliver ~10 mA/cm$^2$.

Figure 14:
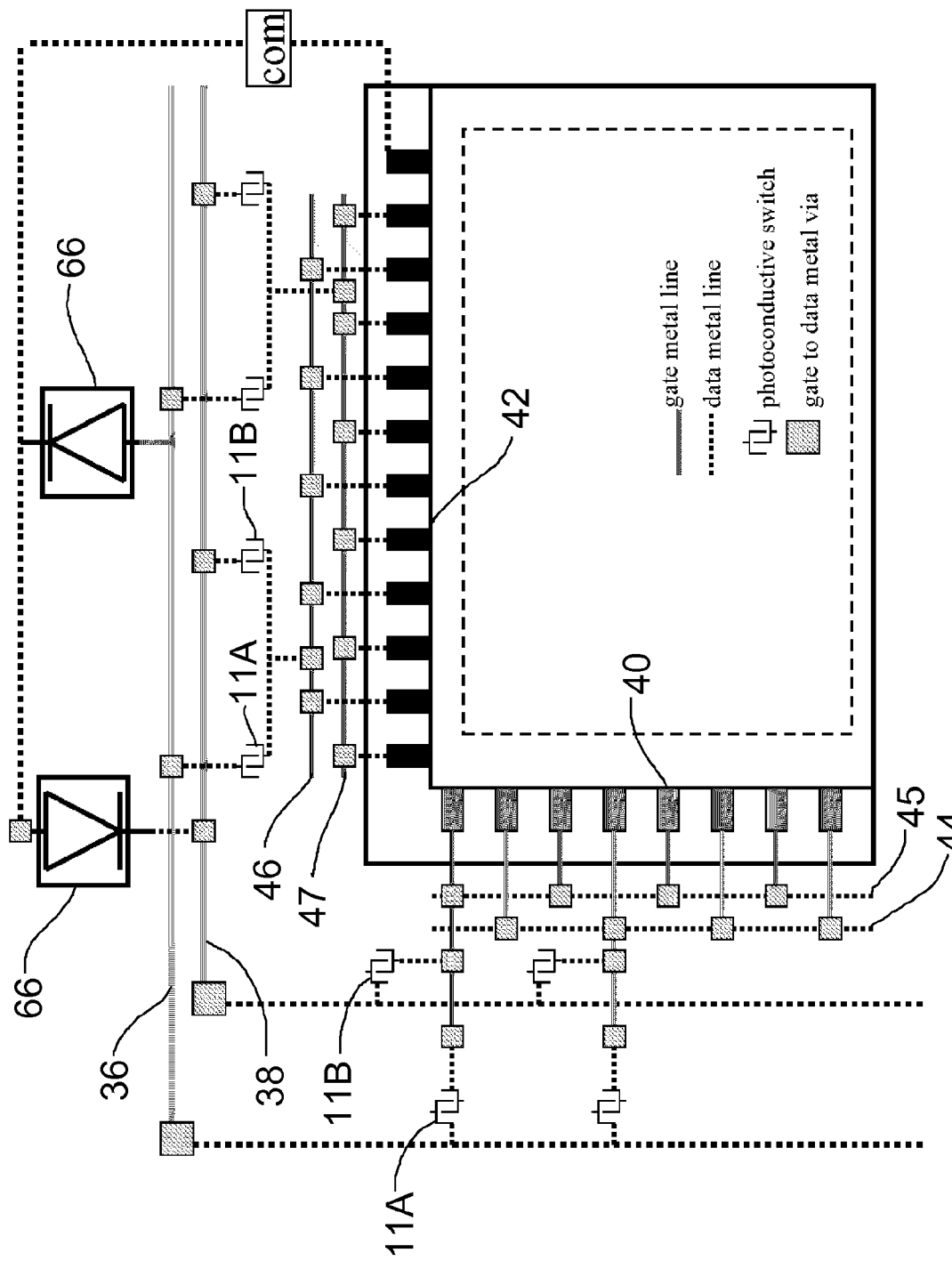
FIG. 14 shows a schematic layout of the photovoltaic supply of power to a portion of a TFT array under test wherein light sources on the test apparatus are in turn used to drive both the photovoltaic cells and the photoconductive switches embedded in the substrate under test.

By incorporating both photovoltaic cells 52 and photoconductive switches 11 into the area between the TFT arrays 28 (i.e. in the scribe lines or lanes) of a TFT substrate, the number of physical probe contacts required during testing can be minimized or even reduced to zero. As shown in FIG. 14, photovoltaic cell arrays 66 (of sufficient area and thus drive current) can be used to provide positive and negative DC supply to a portion of the TFT panel 28 under test. In this case, a test drive apparatus as described above with reference to FIG. 7 may be modified such that LEDs 24 on the test apparatus 26 drive both the photoconductive switches 11 and the photovoltaic power supplies 66. While the photoconductive switches 11 require rather intense light (>10 W/cm$^2$) to be switched to a low resistance state (i.e. turned "on"), it is sufficient to illuminate the photovoltaic power supplies 66 with lower intensity LEDs (~0.1 W/cm$^2$). In both cases, the optimal wavelength band of the LED sources is in the green part of the visible light spectrum.

Figure 15:
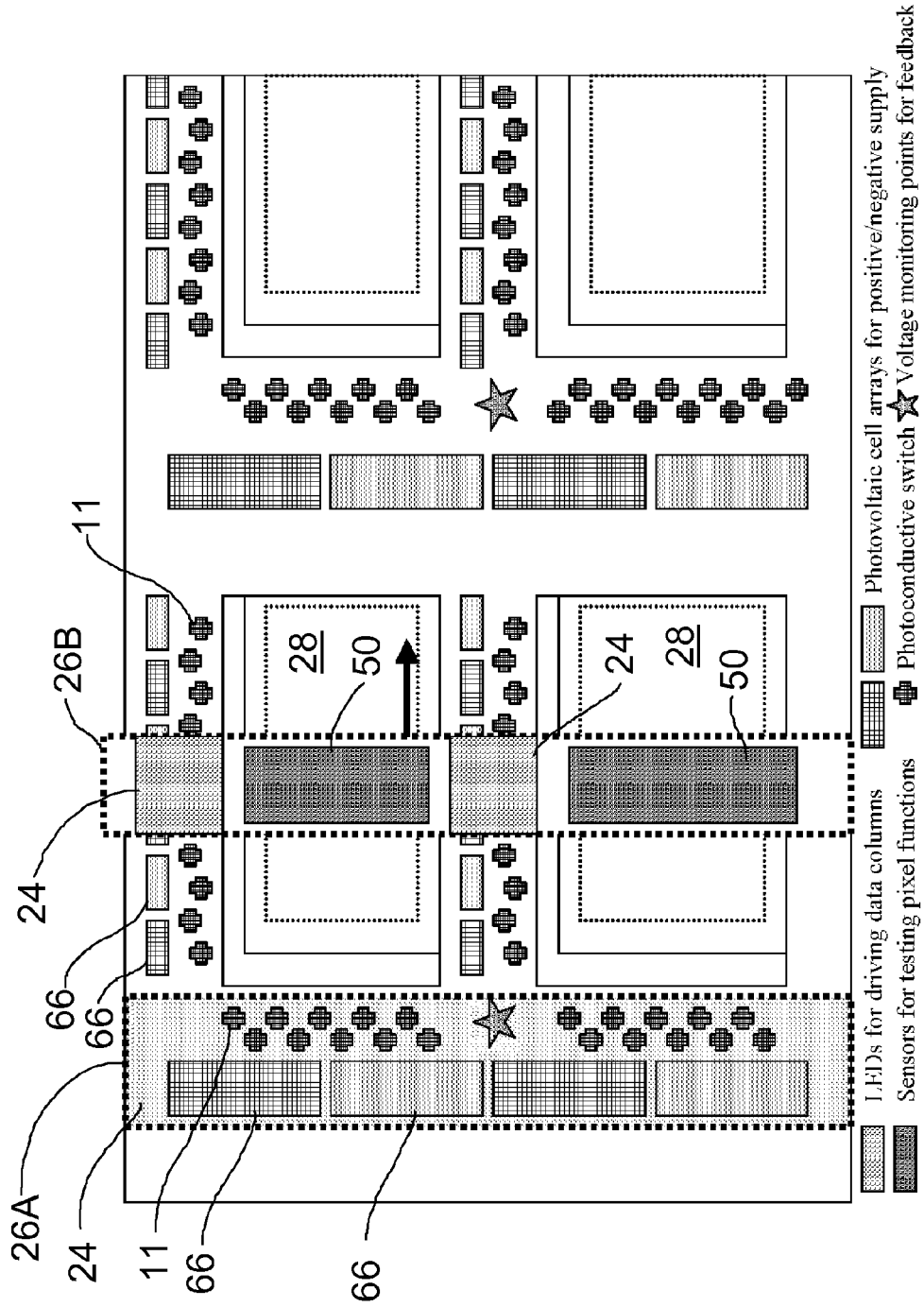
FIG. 15 shows a schematic layout for a procedure for testing adjacent TFT array panels in a parallel process wherein light sources on the testing sub-units are used to control the flow of current from the supply cells, and the supply cells are photovoltaic cell arrays, also driven by light sources on the two testing sub-units.

FIG. 15 shows a slightly modified block diagram, compared to that illustrated in FIG. 7, for testing one or more adjacent TFT arrays 28. Again, the gate and data lines 30 and 32, the contact pads 40 and 42, and supply rails and 36 and 38 present in FIGS. 4 and 5 are not shown for clarity. Two interconnected testing sub-units 26A and 26B can be used, as described with reference to FIG. 7. A first testing sub-unit 26A is used to drive the photovoltaic cells 66 and photoconductive switches 11 associated with the gate lines of one or more TFT array panels 28 that are being simultaneously scanned by a second testing sub-unit 26B. First testing sub-unit 26A may be a stationary or moving unit relative to the panel 28 or other device under test. The second testing sub-unit 26B contains both sensors 50 to image or scan and detect the operation and status of the pixels and LEDs 24 to drive the photovoltaic cells 66 and photoconductive switches 11 associated with the data lines under test. Since the LEDs 24 associated with the data line photovoltaic cells 66 and photoconductive switches 11 lie on the same testing sub-unit (the scanning apparatus) 26B, power generation and current flow can be restricted to the portion of the substrate that is under test by the sensors 50 at a given time. First testing sub-unit 26A and second testing sub-unit 26B each can be separately mobile relative to the device under test. Depending on the conditions of the test, first testing sub-unit 26A can be held stationary, can be mobile together with second testing sub-unit 26B, or can move independently of second testing sub-unit 26B. It will be recognized that, when first testing sub-unit 26A and second testing sub-unit 26B move independently, they may have different orientations relative to the panel 28, or other device, under test. Furthermore, testing of portions of the device under test may be conducted in a parallel manner, or different sections in sequence, or in other programmed manners for testing performance or for defect analysis, as will be understood by those skilled in the art of testing devices. These features are also applicable to the device described with reference to FIG. 7.

As an alternative, the photovoltaic cells 66 for both gate row and data column drive power could be placed so that they lie underneath the first testing sub-unit 26A (not shown). This would minimize the space required for the cells driving the data columns since only those data columns underneath the scanning test unit draw current at a given time. In other words, a relatively small photovoltaic power source can be used to drive the supply rails that interconnect all of the data columns as in FIG. 6.

As in the discussion regarding FIG. 7, alternative testing approaches are possible. In one alternative embodiment, the circuitry is such that the roles of the gate row lines and the data column lines are interchangeable. In this case, a single testing sub-unit contains LEDs to drive photoconductive switches associated with gate row lines and sensing elements to assess the operation of pixels in the TFT array. In another alternative embodiment, all of the LEDs for driving photoconductive switches (associated with both the gate row lines an data column lines) are contained within a single testing sub-unit. In this case, the second testing sub-unit contains the sensing elements used to assess the operation of pixels in the TFT array.

When there is non-contact generation of a voltage supply as described above, it is desirable to incorporate some means of verifying or monitoring the voltage level generated by the power cell. This would be desirable, for example, when the non-contact testing of the pixels in the TFT array (by voltage imaging or capacitive coupling, etc.) is dependent on accurate knowledge of the voltage level used to drive the gate and data lines.

One approach to verifying or monitoring the voltage level generated is to incorporate contact pads configured to lie outside the area under the testing sub-units. These contact pads are probed very briefly prior to the testing procedure, to assess the voltage levels generated by the power cells. This measurement is fed back to the testing sub-units in order to modify the signal levels towards the desired levels. For example, in the case of the photovoltaic cell the light intensity delivered by the LEDs on the testing sub-unit can be adjusted upwards or downwards.

An alternative approach to verifying and monitoring the voltage levels is to incorporate non-contact sensing elements into the testing sub-units. These sensing elements could be of the voltage imaging type (based on electro-optic effects) or of the capacitive or inductive coupling type. As another option, circuitry for voltage to frequency conversion could be incorporated adjacent to the power generation cells on the TFT panel, and the frequency could be coupled inductively to wireless receiver circuitry on the testing units to monitor the voltage level. Generally, the voltage could be converted into another analog or digital form for transmission using analog or digital means by inductive, optical or magnetic feedback to the testing unit.

Another approach is to combine the contact calibration step described above with the non-contact feedback technique described above such that the voltage level is sampled using contact means to calibrate the voltage and feedback loop. There after, the contact means are removed and the voltage is monitored and regulated according to the voltage feedback provided without contact.

There is the possibility for defects in power generation cells 66, which in some cases would render them inoperable for the intended application. To mitigate against such an equipment failure, it is possible to incorporate contact pads (not shown) that lie outside the area of the testing sub-units, which would be used to provide power to a section of the TFT arrays in the event that the non-contact power cells associated with that section are inoperable.

Another approach for the mitigation of defects is to build redundancy into the non-contact power supply circuitry. For example, two independent photovoltaic cells could be wired in parallel to the same group of gate row lines or data column lines. The size of these cells is chosen such that adequate drive current and voltage is delivered by one of the cells, so that the failure of one or the other cell would not preclude the testing of the TFT array.

There is also the possibility for defects in photoconductive switch cells 11, which in some cases would render them inoperable for the intended application. To mitigate against such a failure, it is possible to incorporate contact pads that lie outside the area of the testing sub-units, which would be used to provide a means to bypass the defective cell with contact means.

Another approach for the mitigation of photoconductive switch defects is to build redundancy into the circuitry. For example, two independent photoconductive switch cells could be wired in parallel to the same group of gate row lines or data column lines. The size of these cells is chosen such that adequate drive current and voltage is delivered by one of the cells, so that the failure of one or the other cell would not preclude the testing of the TFT array.

Design Considerations Photoconductive Switches

We have found that a useful expression for calculating the minimum (i.e. "on" state) resistance of an interdigitated photoconductive switch as illustrated in FIG. 1 is:

$$R_{PH}^{min} \approx \frac{2L^2}{\sigma_{PH} A \cdot t} \quad (1)$$

where L is the finger spacing (assumed equal to finger width), A is the area occupied by the interdigitated electrode pattern, t is the thickness of the a-Si:H layer, and $\sigma_{PH}$ is the (peak) photoconductivity under maximum illumination. If the switch geometry is a square, then $A=W^2$, where W is the side length of the switch. We have found experimentally that the photoconductivity of the a-Si:H layer can be as high as $\sim 2 \times 10^{-3}$ S/cm under illumination by green light of intensity $\sim 30$ W/cm². Green LEDs with intensities on this order and junction areas up to $\sim 1$ mm² are available commercially.

Figure 16:
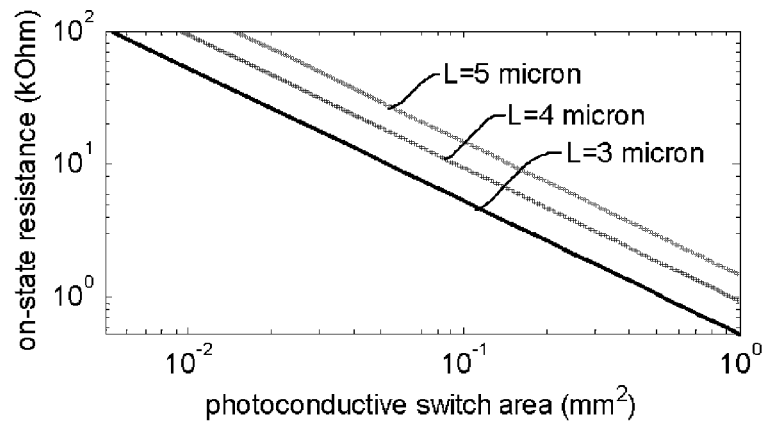
FIG. 16 is a plot showing the relationship between on-state resistance of an a-Si:H photoconductive switch and area of the switch, with finger spacing 3, 4 and 5 µm, when a-Si:H layer thickness is 0.17 µm and peak photoconductivity is $2 \times 10^{-3}$ S/cm.

Since t is fixed for a given TFT process, and $\sigma_{PH}$ is limited by the practical intensity of compatible LED light sources, the "on" state resistance of a switch is determined mainly by L and W. The minimum value for L is determined by the minimum feature size for the data metal layer of the TFT process, which is typically 3-5 μm. Referring to FIG. 16, the "on" state resistance corresponding to the maximum photoconductivity of an a-Si:H photoconductive switch is plotted as a function of the area, for three different values of finger spacing. As discussed above, the photoconductive switches in one proposed layout must have dimensions on the order of the spacing between gate lines or between data lines, and so dimensions should normally be in the 100-500 μm range. Switches of this size can exhibit "on" state resistance of a few kΩ or less, as shown in FIG. 16. As mentioned above, this is similar to the effective resistance presented by a typical gate row line or data column line within a TFT array, so that switches of this size when in their "on" state effectively provide short-circuit connection between the power supply rail and the gate or data line.

The "on" state resistance, and therefore size, required for a given photoconductive switch 11 is determined by the effective load on the switch and by the required switching speed for the circuit.

Figure 17:
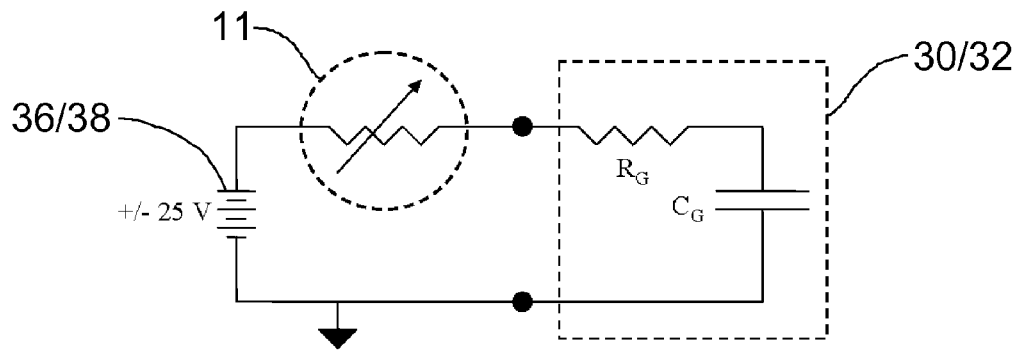
FIG. 17 shows a circuit illustrating the interconnection of a bias supply rail and a TFT gate line via a photoconductive switch.

Referring to FIG. 17, the interconnection of a supply rail 36/38 and a gate row line 30 (or data line 32) via a photoconductive switch 11 is well represented by a simple RC equivalent circuit. For a typical display, the equivalent gate line resistance and capacitance are approximately 3 kΩ and 840 pF, for example. Furthermore, during testing it is desired to switch (i.e. between charge and discharge) individual gate lines on time scales in the 5-10 μs range. Thus, assuming a required RC time constant of 5 μs, the "on" state resistance of the photoconductive switch driving a gate line normally should be less than approximately 3 kΩ, and so the sum of the "on" state switch resistance and the intrinsic gate line resistance should be less than approximately 6 kΩ. Referring again to FIG. 16, the photoconductive switch must occupy an area on the order of 0.1-0.25 mm².

An analogous circuit schematic holds for the case of data column lines. However, data lines within a typical TFT array present a similar effective load resistance of a few kΩ, but must have a much smaller effective load capacitance, typically tens of pF. Assuming similar switching time requirements as cited for the gate lines above, this implies that smaller photoconductive switches can be used. For example, assuming a data line capacitance of 20 pF and an on-state resistance of 100 kΩ for the photoconductive switch, the RC time constant is approximately 2 μs. Referring again to FIG. 16, switches with areas in the 0.01 to 0.02 mm² range are adequate for implementation of the method.

Design Considerations: Power Supply

Power may be supplied to at least one of the components of the device using various means, such as external contacts or probes for contacting contact pads at the apparatus, fixed wiring to one or more components of the apparatus, inductive coupling, illumination of photoactive material, and one or more batteries placed or formed on the structure or substrate. These approaches may be used alone or in combination. Different methods of supplying power to one or more of the components of the apparatus may be used at different times or for different purposes, including temporary power supply, calibration, local testing and a full program of testing of one or more panels.

Design Considerations Photovoltaic Cells

Figure 18:
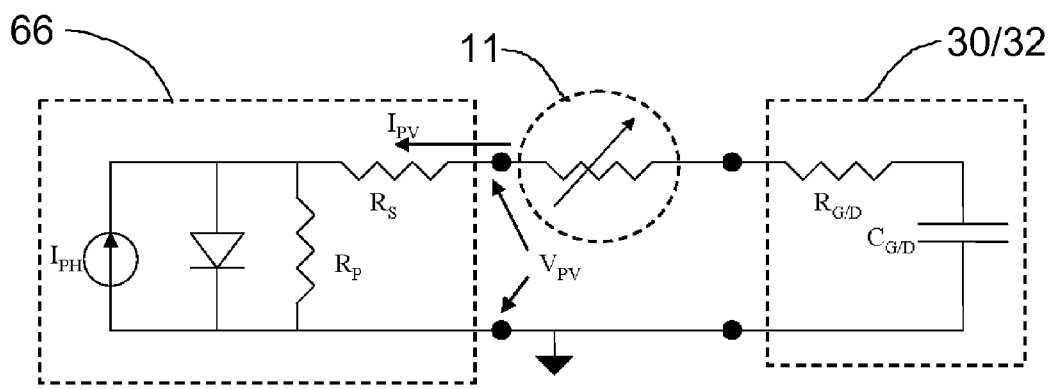
FIG. 18 shows the equivalent circuit representing the interconnection of a photovoltaic cell array and a TFT gate or data line, via a photoconductive switch, where $I_{PV}$ and $V_{PV}$ are the terminal current and voltage of the photovoltaic cell array, respectively, and $R_S$ and $R_P$ are series and parallel parasitic resistances of the cell, respectively.

FIG. 18 shows a gate row 30 or data column 32 (represented by its Thevenin equivalent circuit) driven via a photoconductive switch 11 by a simplified equivalent circuit of a photovoltaic cell 66. Preferably, for a high quality cell, the series parasitic resistance is designed to be very low and the parallel parasitic resistance is designed to be very high. We first consider the current drive requirements for the case of a photovoltaic cell 66 driving a gate row 30 or data column 32 or a group of rows/columns. To charge the effective capacitance of a group of gate rows 32 with total capacitance CG from 0 to voltage V in time $\Delta t$, the required current (from the cell 66) is approximately given by:

$$I_{drive} \approx \frac{C_G V}{\Delta t} \quad (2)$$

As mentioned above, a single gate row has typical capacitance ~840 pF so that a drive current of 0.1-1 mA is required to charge such a line from 0 to 10 V in 10-100 μs. Note that the photoconductive switches 11 designed above were designed to support this level of current flow: for example, for a gate line the initial current on closing the switch is ~2 mA (10 V/5 kΩ). Referring to FIG. 12, when a photovoltaic cell 66 can deliver 10 mA/cm$^2$ the area of the single unit cell 52 in the photovoltaic source 66 driving this gate line 30 must be about 1-10 mm$^2$. Since each unit cell 52 can generate ~0.5 V terminal voltage, the total area of the photovoltaic cell array required to drive a single gate row is ~20-200 mm$^2$. If an N-fold plurality of gate rows is driven from the same cell array then the area must also increase N-fold. Furthermore, the required area will scale directly in proportion to the required voltage.

An analogous consideration of a typical data column line with capacitance ~20 pF shows that, for the same voltage (10 V) and charging time (10-100 μs), the required drive current is 2-20 μA and the total size of the photovoltaic cell array 66 to charge a single data line to 10 V in 10-100 μs is approximately 0.5-5 mm$^2$. As described above, the required area scales directly with the desired voltage and with the number of parallel data columns to be driven. As described above following description of the architectures illustrated in FIGS. 8 through 11, a single photovoltaic cell 66 can effectively drive a much larger number of data columns than this analysis suggests, provided the photoconductive switches 11 are operated in such a manner that only a small subset of data columns 32 is drawing current from the photovoltaic cell 66 at a given time.

Design considerations: Contactless Power for TFT Array Testing Using Inductive Coupling and/or Optical Switching for Active Rectification and Control.

We will now describe contactless supply of power to activate a TFT array. For simplicity in making the description, we will illustrate the concept by describing the use of inductive coupling and switching elements. One may use other methods to couple power without contact including capacitive coupling or photoactivation.

Figure 19:
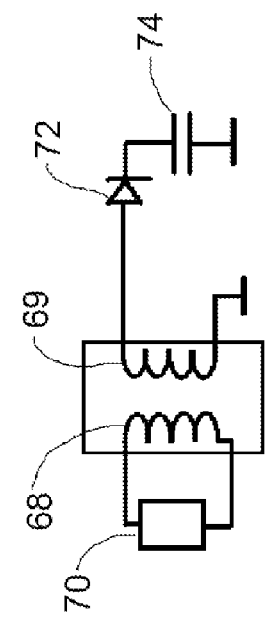
FIG. 19 shows a prior art single diode rectifier power supply.

FIG. 19 shows a single diode rectifier power supply with primary and secondary transformer windings 68 and 69 respectively, source signal 70, rectifier diode 72, and storage or smoothing capacitor 74. The output voltage accuracy of this configuration is a function of the AC voltage of the source 70 and the impedance of the load.

Figure 20:
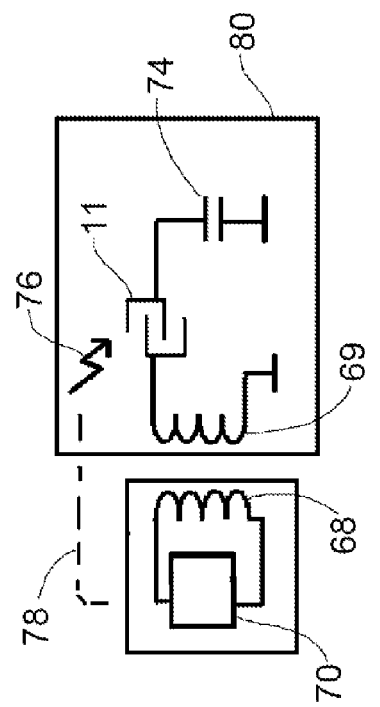
FIG. 20 shows a testing device having a single diode rectifier power supply with an optical switching element in place of a rectifier.

FIG. 20 shows a device that has an optical switching element 11 in place of the rectifier 72 shown in FIG. 19. In this device the source driving the primary inductor 68 is controlled by the source controller 70. An optical switch 11 is controlled and provided with light 76 via a control signal 78 from source controller 70 to provide timed turn "on" and thus provides rectification at the secondary of the inductive coupler 69. In an exemplary form, LCD panel 80 is patterned to have a secondary winding of an inductive coupler 69 as well as optical switching element 11 and a capacitive holding element 74.

Figure 21:
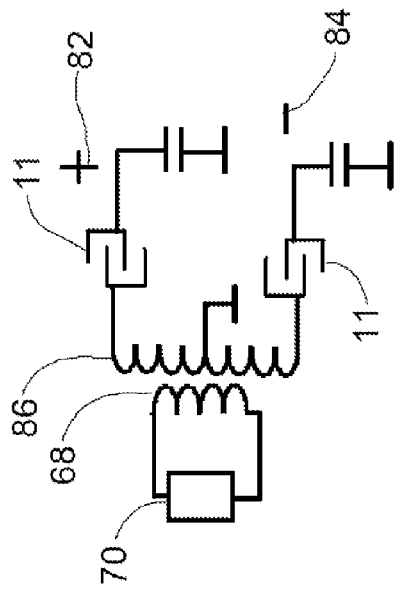
FIG. 21 shows an implementation of the testing device shown in FIG. 21 providing positive and negative voltages to an LCD panel using a center tapped secondary inductor.

FIG. 21 is an implementation of the device shown in FIG. 20 in which positive and negative voltages 82 and 84, respectively, can be provided to LCD panel 80 using a center tapped secondary inductor 86.

Figure 22:
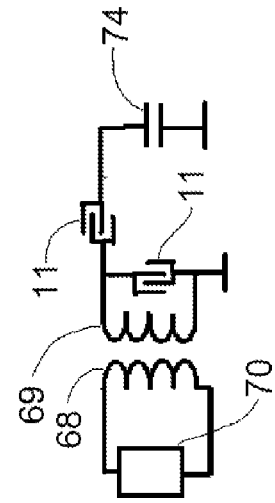
FIG. 22 shows implementation of an optical switching type regulator in which the secondary has two optical switching elements: a forward conducting switch and a catch commutating optical switch, to create a direct current secondary voltage from a primary alternating or pulsed current and voltage.

FIG. 22 is an implementation of the device shown in FIG. 20 in a switching type regulator where the secondary has two optical switching elements: a forward conducting switch 88 and a catch commutating optical switch 90. By control of the timing of these elements a Direct Current (DC) secondary voltage is created from the primary Alternating or Pulsed current and voltage.

One skilled in the art will recognize that there are multiple other possible implementations of the device shown in FIGS. 19 through 22, including full wave rectification, secondary voltage regulation, processing of multi-phased primary or secondary signals, and secondary voltage feedback. It will also be recognized that there are other power supply techniques that may be used, such as a switch mode power supply (SMPS). Topologies of such include buck, boost and flyback configurations where the primary is located on the testing sub-unit and the secondary is located on the TFT substrate.

The purpose and advantage of using optical switching is to have a faster switching element and better capability to withstand higher voltage than that of an integrated diode in typical TFT technologies, of which one prior art example is shown in FIG. 19. By using this type of device, one can control the voltage of the DC potential produced by changing the timing of the optical switching.

Figure 23:
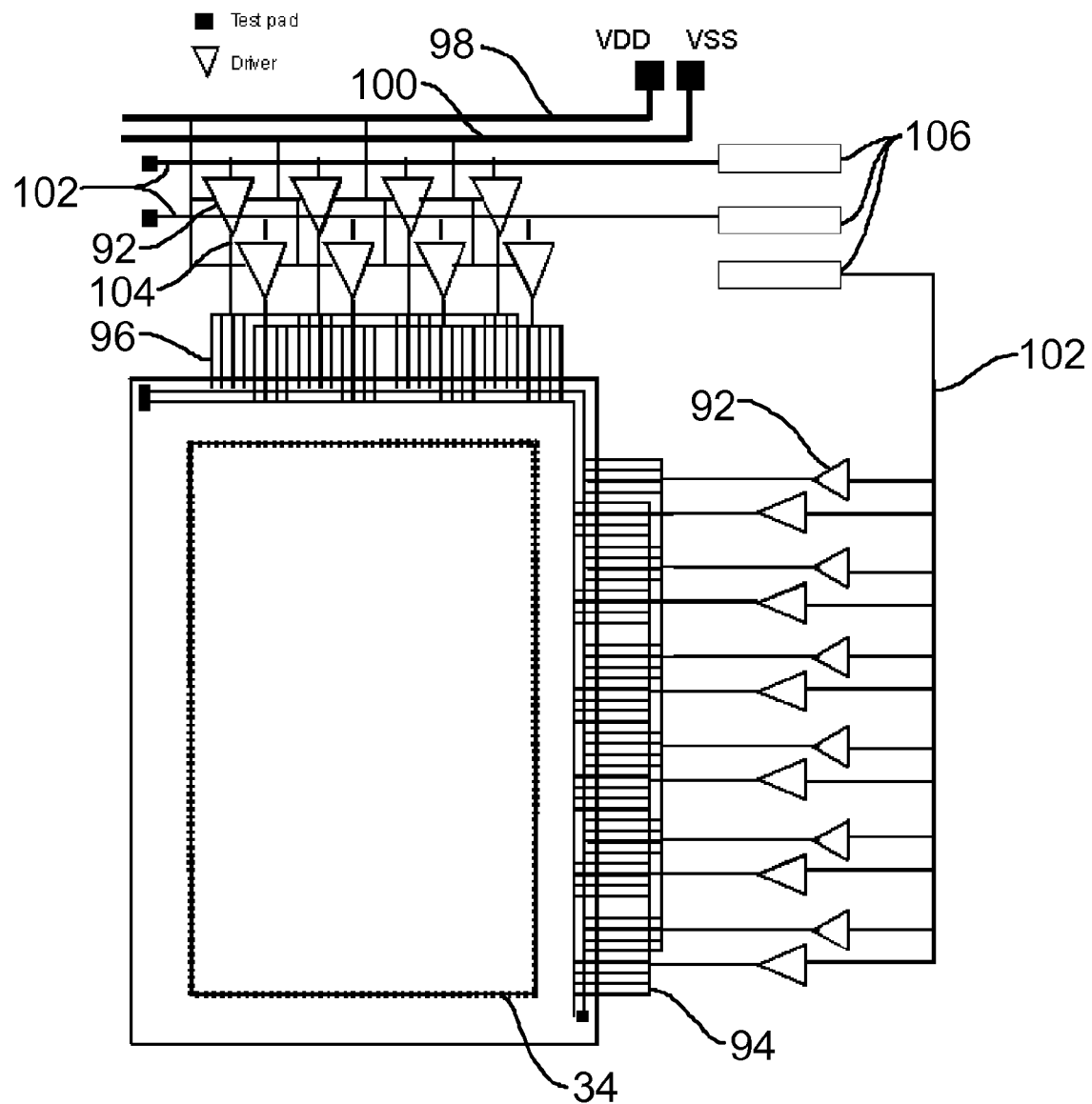
FIG. 23 is a schematic diagram showing an alternative arrangement for connecting the gate and data lines of a TFT array to a pair of positive and negative voltage supply rails, connected via inductively controlled electronic switches when compared to the apparatus illustrated in FIG. 6.

FIG. 23 is an alternative arrangement for connecting the gate and data lines of a TFT array to a pair of positive and negative voltage supply rails, connected via inductive switches when compared to the apparatus illustrated in FIG. 6. Such an approach uses inductively coupled receivers 106 to control an electronic switch 92 with control signals 102. Using electronic switches 92, each of which interconnects a supply rail 98 or 100 to a grouping of gate lines 94 or data lines 98, allows the switches 92 to be larger, and therefore to exhibit lower on-state resistance. Other types of receivers can be used such as magnetically controlled receivers and radio frequency receivers.

Alternatively, photoactivated or radio frequency (RF) receivers may be used instead of inductively coupled elements 106 to control the electronic switches 92. These receivers would then be activated by a coupled light source or a coupled RF source.

Figure 24:
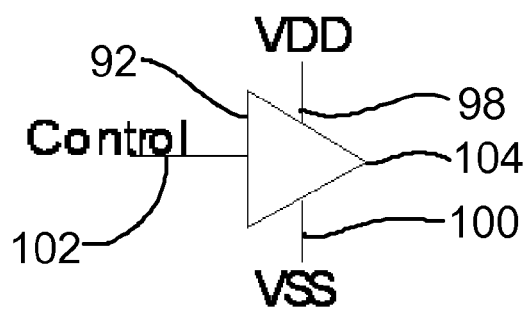
FIG. 24 is a schematic diagram of an inductively or optically controlled electronic switch fabricated in a commercial TFT process.

FIG. 24 is the symbol of an integrated inductively or optically controlled electronic switch 92. It has a positive power input 98, a negative power input 100 and a control input 102 and output 104. The typical operating voltages of the gate and data lines are −25V to +25V but it is understood that other operating voltages can be used. The operating voltages may be varied dynamically during the testing process. With the electronic switch, one can adjust the levels of positive and negative voltage to achieve the desired operating voltage level.

Design Considerations: Different Power Supplies for Test Circuits and Pixel Circuits.

Figure 25:
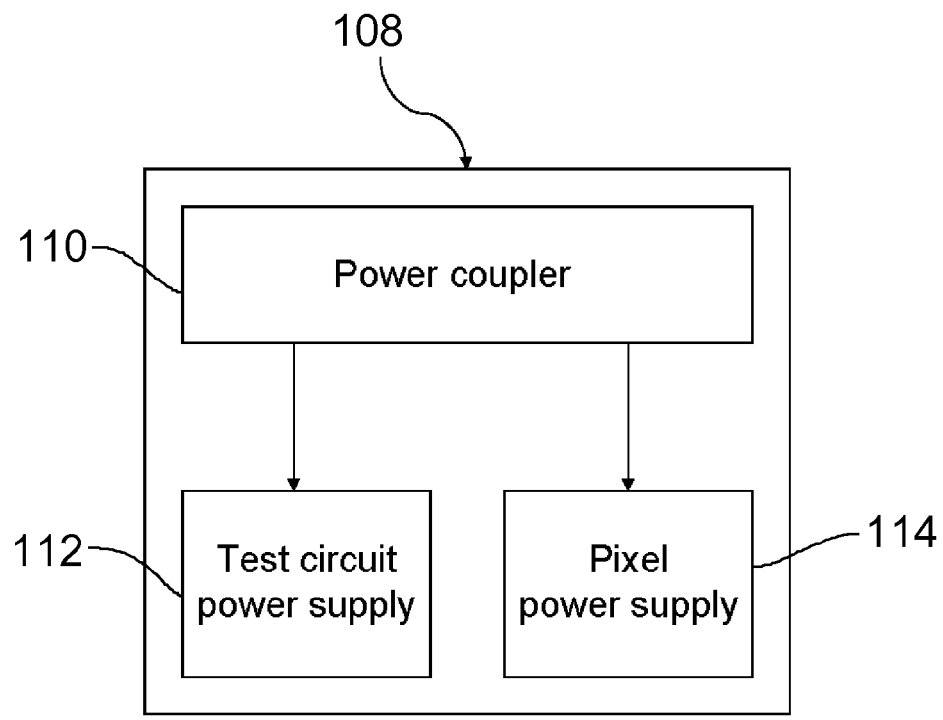
FIG. 25 is a block diagram of a power source.
Figure 26:
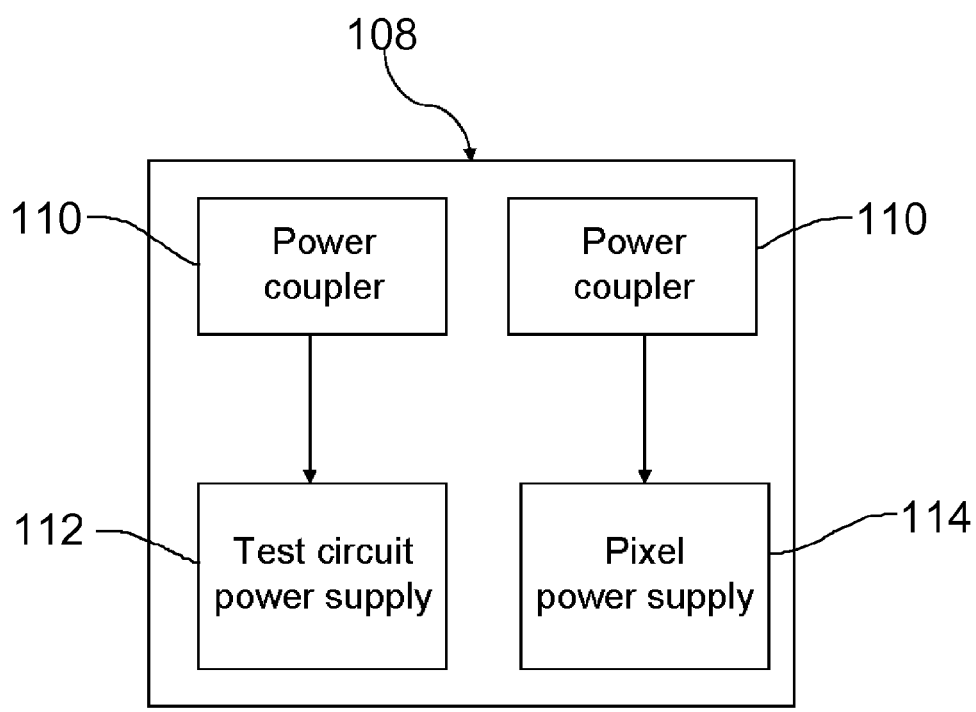
FIG. 26 is a block diagram of an alternative power source where the pixel power supply is coupled separately from the test circuits.

It may be advantageous to have separate power supplies for the test circuitry and pixel circuits. Referring to FIGS. 25 and 26, the power source 108 consists of a power coupler 110 and power supply circuits 112 and 114 for each of the test circuits and pixel circuits, respectively. In this configuration, the test circuits and pixel circuits may be powered separately either from the same power coupler or separate power couplers.

Figure 27:
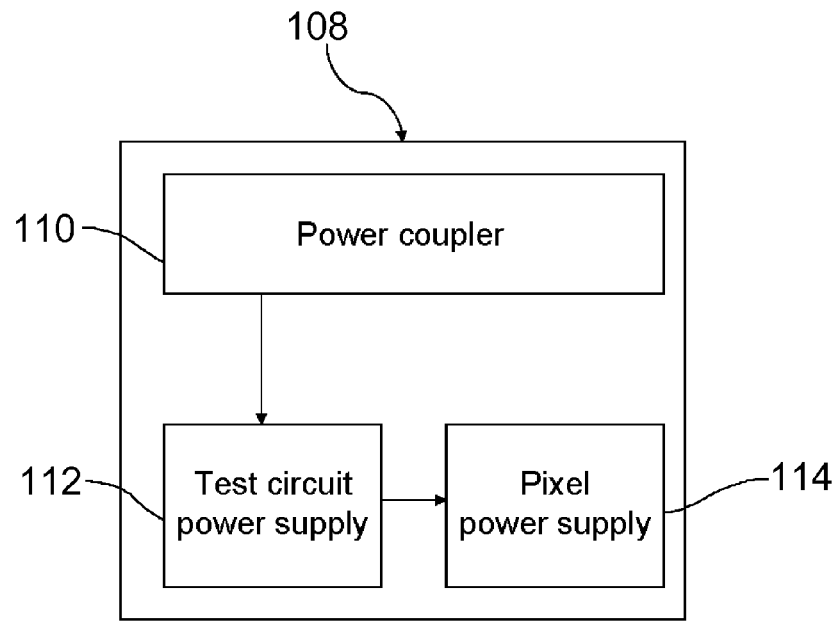
FIG. 27 is a block diagram of an alternative power source where the pixel power supply is connected to the test circuit power supply.

Referring to FIG. 27, the power source 108 consists of a power coupler 110 and power supply circuits 112 and 114 for each of the test circuits and pixel circuits, respectively. In this configuration, the pixel power supply 114 is connected to the same power supply 112 that supplies the test circuits therefore only one power coupler 110 is required.

Figure 28:
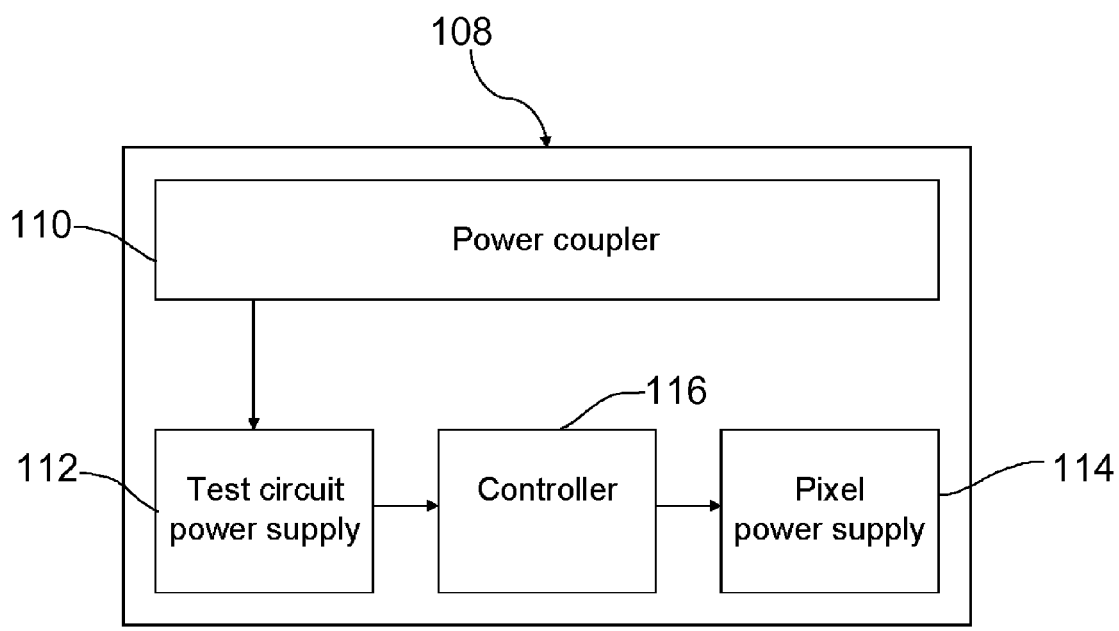
FIG. 28 is a block diagram of an alternative power source that uses a controller to generate the pixel power supply.
Figure 29:
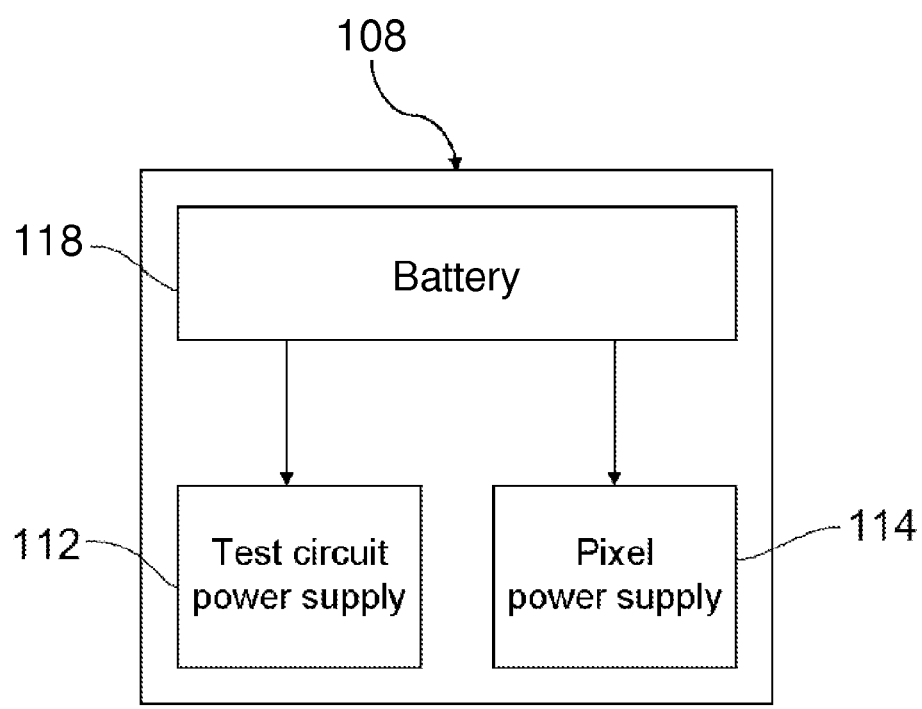
FIG. 29 is a block diagram of an alternative power source that uses a battery.

Referring to FIG. 28, the power source consists of a power coupler 110 and power supply circuits 112 and 114 for each of the test circuits and pixel circuits. In this configuration, the pixel power supply 114 is generated from the test circuit power supply 112 using a controller 116. The controller 116 may produce a static voltage or a time varying voltage or waveform according to the preferred method to stimulate the pixels. Such a technique can improve signal to noise performance of the system.

The power coupler 110 shown in FIGS. 25, 26 and 27 may be implemented using contact based coupling methods such as a contact pad or wire or a wireless technique such as inductive coupling or a photovoltaic cell. Alternatively, referring to FIG. 29, power may be coupled from a battery 118, which may b placed on the TFT substrate or formed on the TFT substrate.

ADVANTAGES OVER THE PRIOR ART

The apparatus and method described above provide several advantages over the prior art:

- Drive power requirements during testing are greatly reduced by the use of photoconductive switches.
- Static voltage power supplies can be used, thus making it feasible to supply the power to the local region under test using a non-contact method, for example using photovoltaic cells embedded in the TFT substrate illuminated by LED sources embedded on the test apparatus. These photovoltaic cells provide drive power to gate and data lines in the same local region under test, and the flow of power is controlled via the photoconductive switches described above.
- Exploiting a photosensitive material, for example active amorphous hydrogenated silicon (a-Si:H), by incorporating a layer in the standard TFT process as a-Si:H photoconductive switches at the interface between the power supply (driving buses) and the gate rows and data columns, it is possible to drive only the portion of the TFT array that lies underneath the sensing and image analysis unit at a given time.
- By incorporating a-Si:H photovoltaic cells adjacent to the photoconductive switches, the power required during testing (to charge the gate and data lines) can be delivered optically to the region under test. Light sources, for example LEDs of appropriate intensity and wavelength, are aligned overtop the photovoltaic cells in the region under test, thereby creating an embedded source of power (with desired voltage and drive current).
- By placing the data line driving LEDs and the pixel charge sensors on the same testing sub-unit, the charging and discharging of pixels is restricted to the portion of the TFT arrays that is actually under test at a given time.
- When power is delivered only to a selected region under test, the power consumed is greatly reduced when compared with prior art devices.
- The area ("real estate") on the substrate of a device under test required for test circuitry and ancillary connections is greatly reduced when compared with prior art apparatus and methods.
- The apparatus and method above allow more rapid testing of one or more devices mounted on a single substrate, devices mounted on one or more substrates, or part of a device, than prior art methods.

In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be one and only one of the elements.

It will be apparent to one skilled in the art that modifications may be made to the illustrated embodiment without departing from the spirit and scope defined in the Claims.

What is claimed is:

1. A thin film transistor (TFT) array having test circuitry, comprising:
   a thin film transistor array body having a plurality of pixels arranged in rows and columns;
   test circuitry integrally formed with the body external to each of the rows and columns, the test circuitry comprising:
   means for supplying power via the test circuitry to the rows and columns of pixels on the body; and
   a plurality of wireless switches connecting each row and each column to the means for supplying power to activate selected pixels by supplying power to a selected row or rows and a selected column or columns.

2. The TFT array of claim 1, wherein the means for supplying power to the rows and columns of pixels on the body includes at least one power supply rail.

3. The TFT array of claim 2, wherein the means for supplying power to the rows and columns of pixels of the body includes a positive power supply rail, a negative power supply rail and means for connecting the positive power supply rail and the negative power supply rail to a power source.

4. The TFT array of claim 3, wherein the positive power supply rail and the negative power supply rail are positioned on the periphery of the body outside of the rows and columns of pixels.

5. The TFT array of claim 1, wherein the wireless switches are photoconductive switches activated via a light source.

6. The TFT array of claim 1, wherein the wireless switches comprise a wireless receiver and an electronic switch.

7. The TFT array of claim 6, wherein the wireless receiver is one of an inductively coupled receiver, a coupled light receiver, a photoactivated receiver, and a radio frequency receiver.

8. The TFT array of claim 1, wherein the test circuitry has at least one contact pad which serve as means for supplying power via the test circuitry to the body.

9. The TFT array of claim 1, wherein the test circuitry has at least one wireless power receiver which serves as means for supplying power via the test circuitry to the body.

10. The TFT array of claim 9, wherein the wireless power receiver is a photovoltaic cell.

11. The TFT array of claim 9, wherein the wireless power receiver is an inductively coupled circuit.

12. The TFT array of claim 1, wherein the test circuitry has a battery which serves as means to supply power to via the test circuitry to the body.

13. The TFT array of claim 12, wherein the battery is formed on the body.

14. The TFT array of claim 1, further comprising means for supplying power to the test circuitry.

15. The TFT array of claim 14, wherein the means for supplying power via the test circuitry to the body is the same as the means for supplying power to the test circuitry.

16. The TFT array of claim 14, wherein the means for supplying power via the test circuitry to the body and the means for supplying power to the test circuitry are separate.

17. The TFT array of claim 1, wherein the means for supplying power via the test circuitry to the body is a controllable power supply.

18. An apparatus for testing a thin film transistor (TFT) array having a plurality of pixels arranged in rows and columns, the apparatus comprising:

means for supplying power via the test circuitry to the rows and columns of pixels on the body;

a plurality of wireless switches connecting each row and each column to the means for supplying power to activate selected pixels by supplying power to a selected row or rows and a selected column or columns; and a sensor unit positioned on the array, the sensor unit having at least one wireless controller for selectively controlling the wireless switches.

19. The apparatus of claim 18, wherein the means for supplying power via the test circuitry to the body is a controllable power supply, such that the power applied to the select pixels may be varied.

20. The apparatus of claim 18, wherein, the wireless switches are photoconductive switches and the wireless controller is a light source.

21. The apparatus of claim 20, wherein the light source is a light emitting diode.

22. The apparatus of claim 21, wherein the light emitting diode emits green light.

23. The apparatus of claim 18, wherein the wireless switches are inductively controlled electronic switches and the wireless controller is a coupled electromagnetic source.

24. The apparatus of claim 23, wherein the coupled electromagnetic source is an inductor.

25. The apparatus of claim 18 wherein the wireless switches are optically controlled electronic switches and the wireless controller is a coupled light source.

26. The apparatus of claim 25, wherein the photoconductive switches comprise a photosensitive layer of amorphous hydrogenated silicon (a-Si:H).

27. The apparatus of claim 26, wherein gate metal is positioned below the layer of a-Si:H, such that unabsorbed electromagnetic radiation is reflected back toward the layer of a-Si:H.

28. The apparatus of claim 18, wherein the wireless switches are radio frequency controlled electronic switches and the wireless controller is a radio frequency source.

29. The apparatus of claim 28, wherein the radio frequency source is a radio frequency transmitter.

30. The apparatus of claim 18, wherein the means for supplying power is selected from a group consisting of a contact pad for contacting an external power supply, an onboard power supply, an inductive coupling circuit, a photovoltaic cell, a battery, or a combination thereof.

31. The apparatus of claim 18, wherein the sensor unit travels in a non-contact manner parallel to the top surface of the array.

32. The apparatus of claim 18, wherein the sensor unit comprises a first sub-unit having at least one wireless controller for selectively activating wireless switches and a second sub-unit having a receiver for receiving signals from the TFT array.

33. The apparatus of claim 32, wherein the second sub-unit further comprises at least one wireless controller.

34. The apparatus of claim 33, wherein the first sub-unit selectively activates wireless switches on one of the rows and the columns and the second sub-unit selectively activates wireless switches on the other of the columns and the rows.

35. The apparatus of claim 34, wherein the first sub-unit and the second sub-unit move dependently or independently.

36. The apparatus of claim 35, further comprising a control unit for controlling the position of the first subunit and the second sub-unit.

37. The apparatus of claim 32, further comprising more than one wireless controller, and a control unit for selectively controlling the wireless controllers.

38. The apparatus of claim 32, further comprising a control unit for controlling the first sub-unit and the second sub-unit.

39. The apparatus of claim 18, further comprising a receiver for receiving signals from the TFT array.

40. The apparatus of claim 39, further comprising a control unit for controlling the sensor unit and for analyzing the signals received by the receiver.

41. The apparatus of claim 18, wherein the power source comprises a positive voltage source and a negative voltage source, with each row and each column having a wireless switch connected to the positive voltage source, and a wireless switch connected to the negative voltage source.

42. The apparatus of claim 41, wherein, each row and each column has a controllable electronic switch connected to the positive voltage source, and a controllable electronic switch connected to the negative voltage source.

43. The apparatus of claim 18, further comprising multiple TFT arrays.

44. The apparatus of claim 18, wherein groups of rows are connected to a single wireless switch and groups of columns are connected to a single wireless switch.

45. A method for testing thin film transistor (TFT) array, the TFT array comprising a plurality of pixels arranged in rows and columns, the method comprising the steps of:

providing means for supplying power to the rows and columns of the body via test circuitry;

connecting wireless switches to control power going to the rows and the columns from the means for supplying power;

positioning a sensor unit on the array, the sensor unit having at least one wireless controller for selectively controlling the wireless switches;

activating select pixels by controlling the wireless switches using the wireless controller to supply power to a selected row or rows and a selected column or columns.

46. The method of claim 45, further comprising the step of the sensor unit travelling in a non-contact manner parallel to the top surface of the array, the sensor unit having a plurality of wireless controllers for controlling the wireless switches.

47. The method of claim 46, further comprising the steps of:

receiving signals from the pixels by a receiver mounted on the sensor unit; and analyzing the signals using a signal processing unit.

* * * * *